(12) United States Patent
Yang et al.

(10) Patent No.: US 12,288,833 B2
(45) Date of Patent: Apr. 29, 2025

(54) PIXEL AND DISPLAY DEVICE COMPRISING SAME

(71) Applicant: SAMSUNG DISPLAY CO., LTD., Yongin-si (KR)

(72) Inventors: Eun A Yang, Yongin-si (KR); Jong Hyuk Kang, Yongin-si (KR); Hyun Deok Im, Yongin-si (KR); Hyun Min Cho, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 634 days.

(21) Appl. No.: 17/608,851

(22) PCT Filed: Mar. 4, 2020

(86) PCT No.: PCT/KR2020/003076
§ 371 (c)(1),
(2) Date: Nov. 4, 2021

(87) PCT Pub. No.: WO2020/226276
PCT Pub. Date: Nov. 12, 2020

(65) Prior Publication Data
US 2022/0278253 A1    Sep. 1, 2022

(30) Foreign Application Priority Data
May 7, 2019    (KR) .................. 10-2019-0053255

(51) Int. Cl.
*H01L 33/38*    (2010.01)
*H01L 27/15*    (2006.01)
*H01L 33/62*    (2010.01)

(52) U.S. Cl.
CPC .......... *H01L 33/382* (2013.01); *H01L 27/156* (2013.01); *H01L 33/62* (2013.01)

(58) Field of Classification Search
None
See application file for complete search history.

(56) References Cited

U.S. PATENT DOCUMENTS 8,872,214 B2    10/2014    Negishi et al.
9,112,112 B2    8/2015    Do et al.
(Continued)

FOREIGN PATENT DOCUMENTS

JP    2014-72215    4/2014
JP    2014-123583    7/2014
(Continued)

OTHER PUBLICATIONS

International Search Report, with English translation, corresponding to International Application No. PCT/KR2020/003076 dated Jun. 12, 2020.
(Continued)

*Primary Examiner* — Bilkis Jahan
(74) *Attorney, Agent, or Firm* — KILE PARK REED & HOUTTEMAN PLLC

(57) ABSTRACT

A display device includes a substrate including a display area and a non-display area; and at least one pixel provided in the display area, and including a pixel circuit layer. The display element layer includes at least one transistor, and a display element layer including at least one light emitting element emitting light, and a first electrode and a second electrode spaced apart from each other, disposed on the substrate, and each extending in a first direction, and the at least one light emitting element is electrically connected to each of the first and the second electrodes. The first electrode has at least two widths in an extension direction of the first electrode. The second electrode has at least two widths in an extension direction of the second electrode.

22 Claims, 21 Drawing Sheets

(56) References Cited

U.S. PATENT DOCUMENTS

| | | | |
|---|---|---|---|
| 9,181,630 B2 | 11/2015 | Shibata et al. | |
| 9,773,761 B2 | 9/2017 | Do | |
| 10,168,844 B2 | 1/2019 | Kwon et al. | |
| 10,802,625 B2* | 10/2020 | Lee | H10K 50/865 |
| 11,460,949 B2* | 10/2022 | Huang | G06F 3/04164 |
| 2011/0089850 A1 | 4/2011 | Shibata et al. | |
| 2013/0168708 A1* | 7/2013 | Shibata | H01L 24/95 |
| | | | 257/88 |
| 2014/0320761 A1* | 10/2014 | Misaki | G06F 3/0446 |
| | | | 349/12 |
| 2017/0229482 A1 | 8/2017 | Chen et al. | |
| 2018/0019369 A1 | 1/2018 | Cho et al. | |
| 2018/0039360 A1* | 2/2018 | Akimoto | H10K 50/86 |
| 2018/0061897 A1* | 3/2018 | Oh | H10K 59/1315 |
| 2018/0122837 A1* | 5/2018 | Kang | H01L 33/38 |
| 2018/0129352 A1* | 5/2018 | Kim | G06F 3/0446 |
| 2018/0175106 A1 | 6/2018 | Kim et al. | |
| 2018/0331160 A1* | 11/2018 | Beak | H10K 50/865 |
| 2019/0096858 A1 | 3/2019 | Woo et al. | |
| 2019/0115513 A1 | 4/2019 | Im et al. | |
| 2019/0358860 A1* | 11/2019 | Anthony | B29C 33/307 |

FOREIGN PATENT DOCUMENTS

| | | |
|---|---|---|
| KR | 10-2009-0115468 | 11/2009 |
| KR | 10-1244926 | 3/2013 |
| KR | 10-2013-0033450 | 4/2013 |
| KR | 10-1490758 | 2/2015 |
| KR | 10-2017-0001935 | 1/2017 |
| KR | 10-2019-0042130 | 4/2019 |
| KR | 10-2020-0060602 | 6/2020 |

OTHER PUBLICATIONS

Written Opinion, with English translation, corresponding to International Application No. PCT/KR2020/003076, dated Jun. 12, 2020.

Korean Notice of Allowance for Korean Patent Application No. 10-2019-0053255, dated Jul. 15, 2024.

* cited by examiner

PIXEL AND DISPLAY DEVICE COMPRISING SAME

CROSS-REFERENCE TO RELATED APPLICATION(S)

This application is a national entry of International Application No. PCT/KR2020/003076, filed on Mar. 4, 2020, which claims under 35 U.S.C. §§ 119(a) and 365(b) priority to and benefits of Korean Patent Application No. 10-2019-0053255, filed on May 7, 2019, in the Korean Intellectual Property Office (KIPO), the entire contents of which are incorporated herein by reference.

BACKGROUND

1. Technical Field

The present disclosure relates to a pixel including a subminiature light emitting element, and a display device including the pixel.

2. Description of Related Art

A light emitting diode may have relatively satisfactory durability even under poor environmental conditions, and have excellent performances in terms of lifetime and luminance.

To apply the LED to a lighting device, a display device, or the like, there is a need to couple the LED to an electrode so that the voltage of the power supply may be applied to the LED. With regard to application purposes of the LED, a method of reducing space needed for the electrode, or a method of fabricating the LED, various researches on arrangement relationship between the LED and the electrode have been conducted.

SUMMARY

An object of the disclosure is to provide a display device in which light emitting elements may be aligned in various directions in an emission area by changing the shape of an alignment electrode so that uniform light output distribution may be achieved in an overall area of the display device.

A display device in accordance with an embodiment of the disclosure may include a substrate including a display area and a non-display area; and at least one pixel provided in the display area, and comprising a pixel circuit layer including at least one transistor, and a display element layer. The display element layer may include at least one light emitting element emitting light, a first electrode and a second electrode spaced apart from each other, disposed on the substrate, and extending in a first direction; and at least one the light emitting element is electrically connected to each of the first and the second electrodes.

In an embodiment of the disclosure, the first electrode may have at least two widths in an extension direction of the first electrode. The second electrode may have at least two widths in an extension direction of the second electrode.

In an embodiment of the disclosure, the first electrode may include first main electrodes extending in the first direction, and first auxiliary electrodes electrically connected to the first main electrodes. The second electrode may include second main electrodes spaced apart from the first main electrodes extending in the first direction, and second auxiliary electrodes electrically connected to the second main electrodes.

In an embodiment of the disclosure, the first main electrodes and the first auxiliary electrodes may be integral with each other, and the second main electrodes and the second auxiliary electrodes may be integral with each other.

In an embodiment of the disclosure, the first main electrodes and the first auxiliary electrodes may have shapes different from each other. The second main electrodes and the second auxiliary electrodes may have shapes different from each other.

In an embodiment of the disclosure, a width of each of the first main electrodes may be greater than a width of each of the first auxiliary electrodes. In an embodiment of the present disclosure, a width of each of the second main electrodes is greater than a width of each of the second auxiliary electrodes.

In an embodiment of the disclosure, each of the first main electrodes may have a shape different from a shape of the first main electrode adjacent to a corresponding one of the first main electrodes in the first direction. In an embodiment of the present disclosure, each of the second main electrodes may have a shape different from a shape of the second main electrode adjacent to a corresponding one of the second main electrodes in the first direction.

In an embodiment of the disclosure, each of the first main electrodes and each of the second main electrodes have an identical shape. Furthermore, each of the first auxiliary electrodes and each of the second auxiliary electrodes may have an identical shape.

In an embodiment of the disclosure, the first auxiliary electrodes may include 1-1-th auxiliary electrodes and 1-2-th auxiliary electrodes which have widths different from each other. Furthermore, the second auxiliary electrodes may include 2-1-th auxiliary electrodes and 2-2-th auxiliary electrodes which have widths different from each other.

In an embodiment of the disclosure, each of the first main electrodes and each of the second main electrodes may have different shapes.

In an embodiment of the disclosure, in a plan view the first main electrodes and the second auxiliary electrodes may be alternately disposed in a second direction intersecting the first direction, and the second main electrodes and the first auxiliary electrodes may be alternately disposed in the second direction. Here, the first main electrodes and the second main electrodes may not be disposed in an identical row.

In an embodiment of the disclosure, in the second direction, the first main electrodes and the second auxiliary electrodes may correspond to each other, and the second main electrodes and the first auxiliary electrodes may correspond to each other.

In an embodiment of the disclosure, among the first main electrodes, the first main electrodes that are disposed in an identical column may be spaced apart from each other. Furthermore, among the second main electrodes, the second main electrodes that are disposed in an identical column may be spaced apart from each other.

In an embodiment of the disclosure, the display element layer may include a first capping layer disposed directly on the first main electrodes and electrically connecting the first main electrodes adjacent to each other in the first direction; and a second capping layer disposed directly on the second main electrodes and electrically connecting the second main electrodes adjacent to each other in the first direction.

In an embodiment of the disclosure, the display element layer may include a first connection line extending in the second direction and electrically connected with the first electrode; a second connection line extending parallel to the first connection line and electrically connected with the second electrode; a bank pattern disposed under each of the first electrode and the second electrode; a first contact electrode electrically connecting the first electrode with an end of the at least one light emitting element; and a second contact electrode configured to electrically connect the second electrode with another end of the at least one light emitting element.

In an embodiment of the disclosure, the first connection line and the first electrode may be integral with each other, and the second connection line and the second electrode may be integral with each other.

In an embodiment of the disclosure, the display element layer may include a first insulating layer overlapping a portion of each of the first and the second electrodes, and a second insulating layer disposed on an upper surface of the at least one light emitting element. The first contact electrode and the second contact electrode may be spaced apart from each other on the second insulating layer and electrically disconnected from each other.

A pixel in accordance with an embodiment of the disclosure may include a first electrode and a second electrode spaced apart from each other on an identical plane, and extending in a direction; and at least one light emitting element electrically connected to each of the first electrode and the second electrode. The first electrode may have at least two widths in an extension direction of the first electrode, and the second electrode may have at least two widths in an extension direction of the second electrode.

The first electrode may include first main electrodes extending in the direction; and first auxiliary electrodes electrically connected to the first main electrodes. The second electrode may include second main electrodes spaced apart from the first main electrodes and extending in the direction; and second auxiliary electrodes electrically connected to the second main electrodes.

The first main electrodes and the first auxiliary electrodes may be integral with each other, and the second main electrodes and the second auxiliary electrodes may be integral with each other.

An embodiment of the disclosure may provide a pixel including light emitting elements which are aligned in various directions by changing the shape of an alignment electrode.

Furthermore, an embodiment of the disclosure may provide a display device including the above-mentioned pixel so that uniform light output distribution may be formed in an overall area of the display device.

The effects of the disclosure are not limited by the foregoing, and other various effects are anticipated herein.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1A:
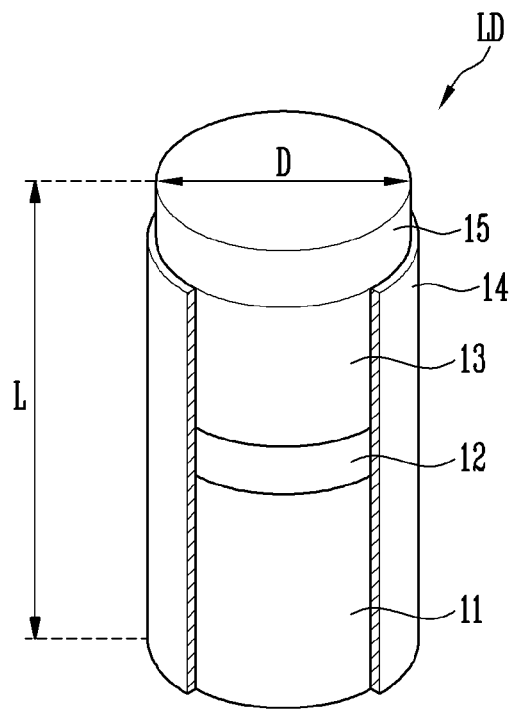
FIG. 1A is a perspective view schematically illustrating a light emitting element in accordance with an embodiment of the disclosure.

As the disclosure allows for various changes and numerous embodiments, particular embodiments will be illustrated in the drawings and described in detail in the written description. However, this is not intended to limit the present disclosure to particular modes of practice, and it is to be appreciated that all changes, equivalents, and substitutes that do not depart from the technical scope of the present disclosure are encompassed in the disclosure.

Throughout the disclosure, like reference numerals refer to like parts throughout the various figures and embodiments of the disclosure. The sizes of elements in the accompanying drawings may be exaggerated for clarity of illustration. It will be understood that, although the terms "first", "second", and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element. In the disclosure, the singular forms are intended to include the plural meanings as well, unless the context clearly indicates otherwise.

It will be further understood that the terms "comprise", "include", "have", and the like in case that used in this specification, specify the presence of stated features, integers, steps, operations, elements, components, and/or combinations of them but do not preclude the presence or addition of one or more other features, integers, steps, operations, elements, components, and/or combinations thereof. Furthermore, in case that a first part such as a layer, a film, a region, or a plate is disposed on a second part, the first part may be not only directly on the second part but a third part may intervene between them. In addition, in case that it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, in case that a first part such as a layer, a film, a region, or a plate is under a second part, the first part may be not only directly under the second part but a third part may intervene between them.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection or coupling.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Embodiments and required details of the present disclosure are described with reference to the accompanying drawings in order to describe the disclosure in detail so that those having ordinary knowledge in the technical field to which the disclosure pertains can easily practice the disclosure. Furthermore, a singular form may include a plural form as long as it is not specifically mentioned in a sentence.

Figure 1B:
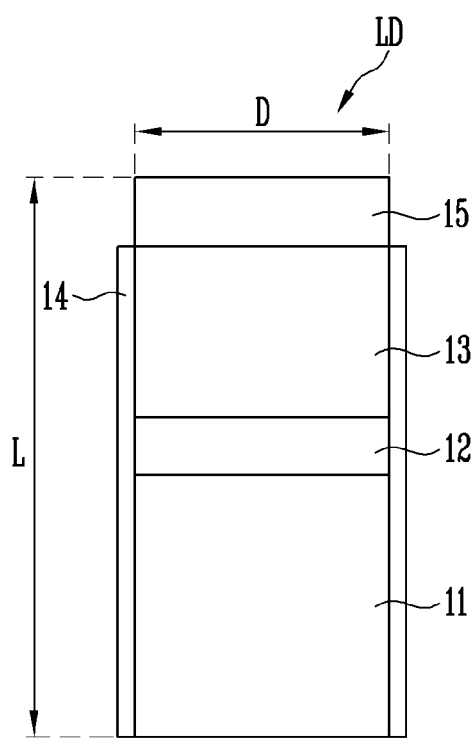
FIG. 1B is a cross-sectional view schematically illustrating the light emitting element of FIG. 1A.
Figure 1C:
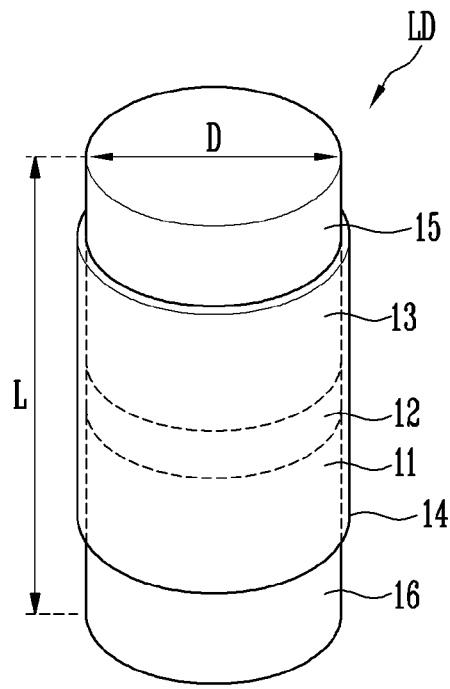
FIG. 1C is a perspective view schematically illustrating a light emitting element in accordance with an embodiment of the disclosure.
Figure 1D:
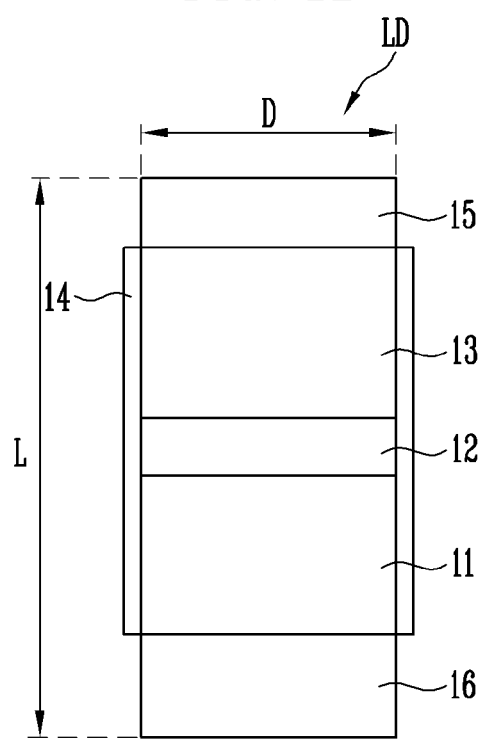
FIG. 1D is a cross-sectional view schematically illustrating the light emitting element of FIG. 1A.
Figure 1E:
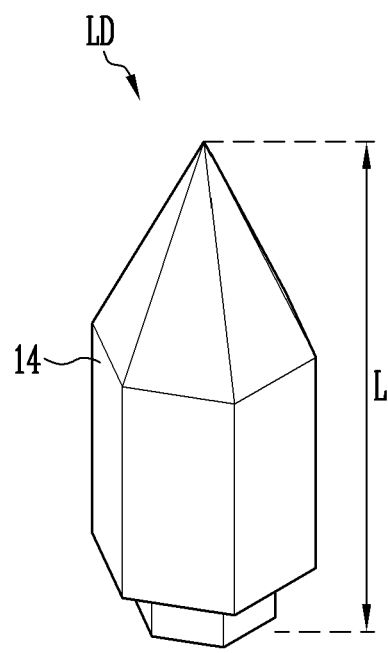
FIG. 1E is a perspective view schematically illustrating a light emitting element in accordance with an embodiment of the disclosure.
Figure 1F:
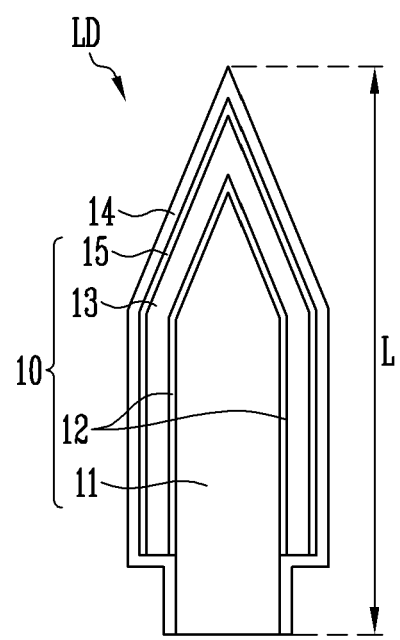
FIG. 1F is a cross-sectional view schematically illustrating the light emitting element of FIG. 1E.

FIG. 1A is a perspective view schematically illustrating a light emitting element in accordance with an embodiment. FIG. 1B is a schematic cross-sectional view illustrating the light emitting element of FIG. 1A. FIG. 1C is a perspective view schematically illustrating a light emitting element in accordance with an embodiment. FIG. 1D is a schematic cross-sectional view illustrating the light emitting element of FIG. 1C. FIG. 1E is a perspective view schematically illustrating a light emitting element in accordance with an embodiment. FIG. 1F is a schematic cross-sectional view illustrating the light emitting element of FIG. 1E.

For the sake of explanation, cylindrical light emitting elements will be described with reference to FIGS. 1A to 1D, and a light emitting element having a core-shell structure will be described with reference to FIGS. 1E and 1F. In an embodiment, the type and/or shape of the light emitting element is not limited to that in the embodiments illustrated in FIGS. 1A to 1F.

First, referring to FIGS. 1A to 1D, a light emitting element LD in accordance with an embodiment may include a first semiconductor layer 11, a second semiconductor layer 13, and an active layer 12 interposed between the first and second semiconductor layers 11 and 13. For example, the light emitting element LD may be implemented as an emission stack formed by successively stacking the first semiconductor layer 11, the active layer 12, and the second semiconductor layer 13.

In an embodiment, the light emitting element LD may be formed in a rod-like shape extending in a direction. If the direction in which the light emitting element LD extends is defined as a longitudinal direction, the light emitting element LD may have a first end and a second end in the extension direction. One of the first and second semiconductor layers 11 and 13 may be disposed in the first end, and the other of the first and second semiconductor layers 11 and 13 may be disposed in the second end.

Although the light emitting element LD may be provided in the form of a cylinder, the disclosure is not limited thereto. The light emitting element LD may include a rod-like shape or a bar-like shape extending in the longitudinal direction (for example, to have an aspect ratio greater than 1). For example, the length L of the light emitting element LD in a longitudinal direction may be greater than a diameter D thereof (or a width of the cross-section thereof). The light emitting element LD may include a light emitting diode fabricated to have a subminiature size, e.g., a length L and/or a diameter D corresponding to the micrometer scale or the nanometer scale.

In an embodiment, the diameter D of the light emitting element LD may range from about 0.5 μm to about 5 μm, and the length L thereof may range from about 1 μm to about 10 μm. However, the size of the light emitting element LD is not limited thereto and may be changed to meet requirements (or design conditions) of a lighting device or a self-emissive display device to which the light emitting element LD is applied.

The first semiconductor layer 11 may include, for example, at least one n-type semiconductor layer. For instance, the first semiconductor layer 11 may include an n-type semiconductor layer which includes any semiconductor material of InAlGaN, GaN, AlGaN, InGaN, AlN, and InN and is doped with a first conductive dopant such as Si, Ge, or Sn. However, the material of the first semiconductor layer 11 is not limited thereto, and the first semiconductor layer 11 may be formed of (or include) various other materials.

The active layer 12 may be disposed on the first semiconductor layer 11 and have a single or multiple quantum well structure. The location of the active layer 12 may be changed in various ways depending on the type of the light emitting element LD. The active layer 12 may emit light having a wavelength ranging from about 400 nm to about 900 nm, and have a double heterostructure. In an embodiment, a cladding layer (not shown) doped with a conductive dopant may be formed on and/or under the active layer 12. For example, the cladding layer may be formed as an AlGaN layer or an InAlGaN layer. In an embodiment, a material such as AlGaN or InAlGaN may be used to form the active layer 12, and various other materials may be used to form the active layer 12.

If an electric field having a predetermined voltage or more is applied to the ends of the light emitting element LD, the light emitting element LD emits light by coupling of electron-hole pairs in the active layer 12. Since light emission of the light emitting element LD can be controlled based on the foregoing principle, the light emitting element LD may be used as a light source of various light emitting devices as well as a pixel of the display device.

The second semiconductor layer 13 may be disposed on the active layer 12 and include a semiconductor layer having a type different from that of the first semiconductor layer 11. For example, the second semiconductor layer 13 may include at least one p-type semiconductor layer. For instance, the second semiconductor layer 13 may include a p-type semiconductor layer which includes any semiconductor material of InAlGaN, GaN, AlGaN, InGaN, AlN, and InN, and is doped with a second conductive dopant such as Mg. However, the material for forming the second semiconductor layer 13 is not limited thereto, and the second semiconductor layer 13 may be formed of various other materials.

In an embodiment, the light emitting element LD may further include an electrode layer 15 disposed on the second semiconductor layer 13, as illustrated in FIGS. 1A and 1B, as well as including the first semiconductor layer 11, the active layer 12, and the second semiconductor layer 13. Furthermore, in an embodiment, as shown in FIGS. 1C and 1D, the light emitting element LD may further include another electrode layer 16 disposed on one end of the first semiconductor layer 11 as well as including the electrode layer 15.

Although each of the electrode layers 15 and 16 may be formed of an ohmic contact electrode, the disclosure is not limited thereto. The electrode layers 15 and 16 may include metal or a metal oxide. For example, chrome (Cr), titanium (Ti), aluminum (Al), gold (Au), nickel (Ni), indium tin oxide (ITO), and an oxide or alloy thereof may be used alone or in combination with each other. However, the present disclosure is not limited thereto.

Materials included in the respective electrode layers 15 and 16 may be equal to or different from each other. The electrode layers 15 and 16 may be substantially transparent or semitransparent. Therefore, light generated from the light emitting element LD may pass through the electrode layers 15 and 16 and may then be emitted outside the light emitting element LD.

In an embodiment, the light emitting element LD may further include an insulating layer 14. However, in some embodiments, the insulating layer 14 may be omitted, or may be provided to cover(or overlap) only some of the first semiconductor layer 11, the active layer 12, and the second semiconductor layer 13.

The insulating layer 14 may prevent the active layer 12 from short-circuiting due to making contact with a conductive material except the first semiconductor layer 11 and the second semiconductor layer 13. Furthermore, thanks to the insulating layer 14, occurrence of a defect in the surface of the light emitting element LD may be minimized, whereby the lifespan and efficiency of the light emitting element LD may be improved. In case that light emitting elements LD are disposed in close contact with each other, the insulating layer 14 may prevent an undesired short circuit from occurring between the light emitting elements LD. It is not limited whether the insulating layer 14 is provided, so long as the active layer 12 can be prevented from short-circuiting with external conductive material.

As illustrated in FIGS. 1A and 1B, the insulating layer 14 may be provided in a portion of the light emitting element LD other than one of ends of the light emitting element LD. In this case, the insulating layer 14 may expose only the electrode layer 15 disposed in one end (or first end) of the second semiconductor layer 13 of the light emitting element LD, and enclose the overall side surfaces of the components other than the electrode layer 15. Here, the insulating layer 14 may allow at least the ends of the light emitting element LD to be exposed to the outside, e.g., allow not only the electrode layer 15 disposed in one end (or first end) of the second semiconductor layer 13 but also one end (or first end) of the first semiconductor layer 11 to be exposed to the outside.

In an embodiment, as illustrated in FIGS. 1C and 1D, in case that the electrode layers 15 and 16 are disposed in the respective opposite ends of the light emitting element LD, the insulating layer 14 may allow at least one area of each of the electrode layers 15 and 16 to be exposed to the outside. As another example, in an embodiment, the insulating layer 14 may not be provided.

In an embodiment, the insulating layer 14 may include transparent insulating material. For example, the insulating layer 14 may include at least one insulating material selected from the group consisting of $SiO_2$, $Si_3N_4$, $Al_2O_3$, and $TiO_2$, but the disclosure is not limited thereto. In other words, various materials having insulating properties may be employed.

If the insulating layer 14 is provided on the light emitting element LD, the active layer 12 may be prevented from short-circuiting with a first and/or second electrode (not illustrated). Furthermore, thanks to the insulating layer 14, occurrence of a defect in the surface of the light emitting element LD may be reduced or minimized, whereby the lifespan and efficiency of the light emitting element LD may be improved. In case that light emitting elements LD are disposed in close contact with each other, the insulating layer 14 may prevent an undesired short circuit from occurring between the light emitting elements LD.

The light emitting element LD may be employed as a light source for various display devices. The light emitting element LD may be fabricated through a surface treatment process. For example, each light emitting element LD may be surface-treated so that, in case that light emitting elements LD are mixed with a fluidic solution (or solvent) and then supplied to each emission area (e.g., an emission area of each sub-pixel), the light emitting elements LD can be evenly dispersed rather than unevenly aggregating in the solution.

A light emitting device including the light emitting element LD described above may be used not only in a display device but also in various devices which requires a light source. For instance, in case that light emitting elements LD are disposed in the emission area of each pixel of a display panel, the light emitting elements LD may be used as a light source of the pixel. However, the application field of the light emitting element LD is not limited to the above-mentioned examples. For example, the light emitting element LD may be used in other types of devices such as a lighting device, which requires a light source.

Next, a light emitting element LD having a core-shell structure will be described with reference to FIGS. 1E and 1F. The following description of the light emitting element LD having a core-shell structure will be focused on differences from the above-mentioned embodiments, and components of the light emitting element LD that are not particularly explained in the following description may comply with those of the preceding embodiments. The same reference numerals will be used to designate components similar to and/or identical with (e.g., corresponding to) those of the above-mentioned embodiments.

Referring to FIGS. 1E and 1F, the light emitting element LD in accordance with an embodiment may include a first semiconductor layer 11, a second semiconductor layer 13, and an active layer 12 interposed between the first and second semiconductor layers 11 and 13. In some embodiments, the light emitting element LD may include an emission pattern 10 having a core-shell structure. The emission pattern 10 may include a first semiconductor layer 11 disposed in a central portion of the light emitting element LD, an active layer 12 which encloses at least one side of the first semiconductor layer 11, a second semiconductor layer 13 which encloses at least one side of the active layer 12, and an electrode layer 15 which encloses at least one side of the second semiconductor layer 13.

The light emitting element LD may be formed in a polypyramid shape extending in a direction. In an embodiment, the light emitting element LD may be provided in the form of a hexagonal pyramid. If the direction in which the light emitting element LD extends is defined as a longitudinal direction (L), the light emitting element LD may have a first end (or a lower end) and a second end (or an upper end) in the longitudinal direction. In an embodiment, one of the first and second semiconductor layers 11 and 13 may be disposed in the first end (or the lower end) of the light emitting element LD. The other one of the first and second semiconductor layers 11 and 13 may be disposed in the second end (or the upper end) of the light emitting element LD.

In an embodiment, the light emitting element LD may have a small size corresponding to the nanometer scale or the micrometer scale, e.g., a diameter and/or a length L having a nanometer scale range or a micrometer scale range. However, in the disclosure, the size of the light emitting element LD is not limited thereto, and the size of the light emitting element LD may be changed to meet requirements (or application conditions) of a lighting device or a self-emissive display device to which the light emitting element LD is applied.

In an embodiment, the first semiconductor layer 11 may be disposed in a core, e.g., a central (or middle) portion, of the light emitting element LD. The light emitting element LD may have a shape corresponding to the shape of the first semiconductor layer 11. For instance, if the first semiconductor layer 11 has a hexagonal pyramid shape, the light emitting element LD and the emission pattern 10 each may also have a hexagonal pyramid shape.

The active layer 12 may be provided and/or formed in a shape enclosing the outer circumferential surface of the first semiconductor layer 11 in the longitudinal direction (L) of the light emitting element LD. In detail, the active layer 12 may be provided and/or formed in a shape enclosing an area of the first semiconductor layer 11, other than a lower end of the opposite ends of the first semiconductor layer 11, in the longitudinal direction (L) of the light emitting element LD.

The second semiconductor layer 13 may be provided and/or formed in a shape enclosing the active layer 12 in the longitudinal direction (L) of the light emitting element LD, and may include a semiconductor layer having a type different from that of the first semiconductor layer 11. For example, the second semiconductor layer 13 may include at least one p-type semiconductor layer.

In an embodiment, the light emitting element LD may include an electrode layer 15 that encloses at least one side of the second semiconductor layer 13. The electrode layer 15 may be an ohmic contact electrode electrically connected to the second semiconductor layer 13, but the disclosure is not limited thereto.

As described above, the light emitting element LD may have a hexagonal pyramid shape with the opposite ends protruding outward, and may be implemented as the emission pattern 10 with a core-shell structure including the first semiconductor layer 11 provided in the central portion thereof, the active layer 12 which encloses the first semiconductor layer 11, the second semiconductor layer 13 which encloses the active layer 12, and the electrode layer 15 which encloses the second semiconductor layer 13. The first semiconductor layer 11 may be disposed in the first end (or the lower end) of the light emitting element LD having a hexagonal pyramid shape, and the electrode layer 15 may be disposed in the second end (or the upper end) of the light emitting element LD.

In an embodiment, the light emitting element LD may further include an insulating layer 14 provided on the outer circumferential surface of the emission pattern 10 having a core-shell structure. The insulating layer 14 may include transparent insulating material.

Figure 2:
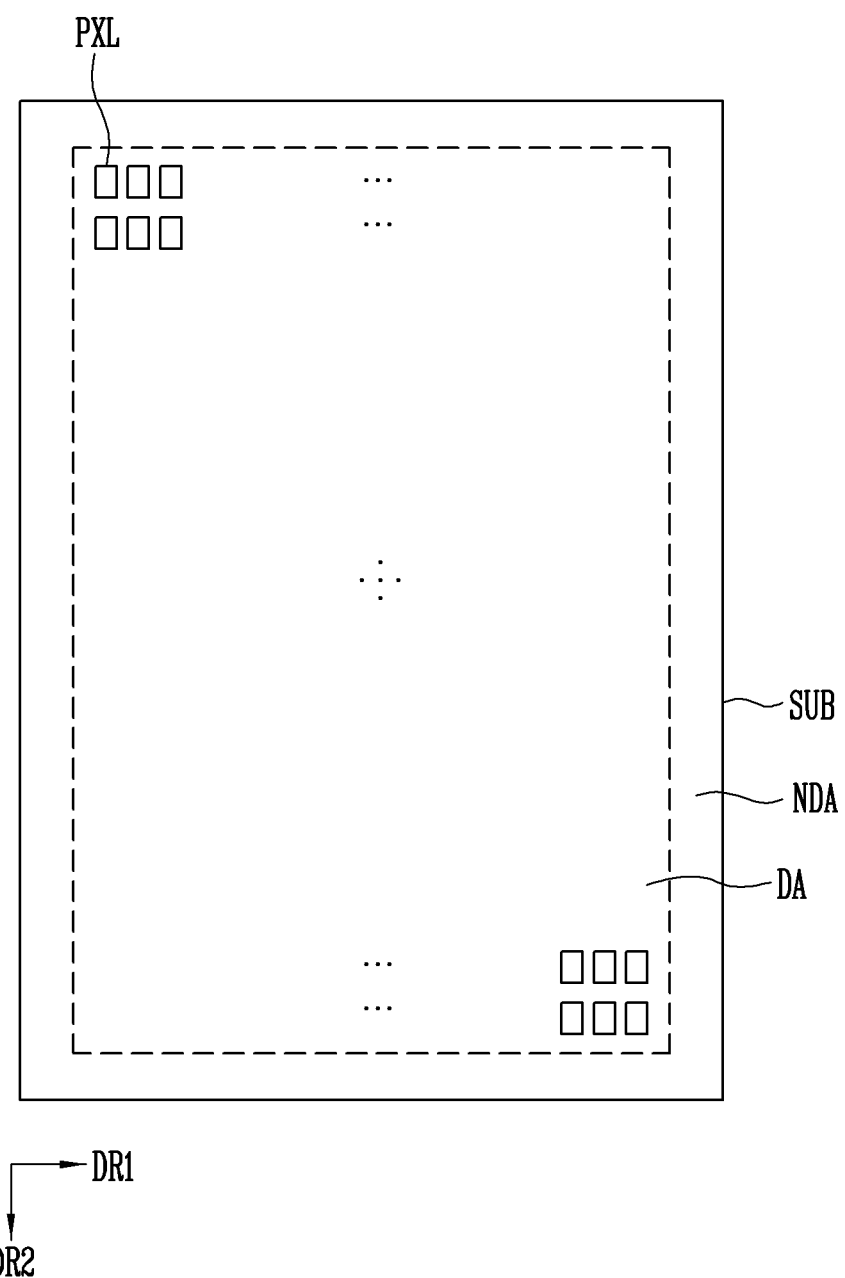
FIG. 2 illustrates a display device in accordance with an embodiment of the disclosure, and particularly, is a schematic plan view illustrating a display device using any one light emitting element of the light emitting elements illustrated in FIGS. 1A to 1F as a light emitting source.

FIG. 2 illustrates a display device in accordance with an embodiment and particularly, is a schematic plan view illustrating a display device using any one light emitting element of the light emitting elements illustrated in FIGS. 1A to 1F as a light emitting source.

For the sake of explanation, FIG. 2 schematically illustrates the structure of the display device, focused on a display area in which an image is displayed. In some embodiments, although not illustrated, at least one driving circuit (e.g., a scan driver and a data driver) and/or lines may be further provided in the display device.

Referring to FIGS. 1A to 1F, and 2, the display device in accordance with the embodiment may include a substrate SUB, pixels PXL provided in the substrate SUB and each including at least one light emitting element LD, a driver (not illustrated) provided in the substrate SUB and configured to drive the pixels PXL, and a line component (not illustrated) provided to electrically connect the pixels PXL with the driver.

The display device may be classified into a passive-matrix type display device and an active-matrix type display device according to a method of driving the light emitting element LD. For example, in case that the display device in accordance with an embodiment is implemented as an active matrix type, each of the pixels PXL may include a driving transistor configured to control the amount of current to be supplied to the light emitting element LD, and a switching transistor configured to transmit data signals to the driving transistor.

Recently, active-matrix type display devices capable of selectively turning on each pixel PXL taking into account the resolution, the contrast, and the working speed have been mainstreamed. However, the disclosure is not limited thereto. For example, passive-matrix type display devices in which pixels PXL may be turned on by groups may also employ components (e.g., first and second electrodes) for driving the light emitting element LD.

The substrate SUB may include a display area DA and a non-display area NDA.

In an embodiment, the display area DA may be disposed in a central area of the display device, and the non-display area NDA may be disposed in a perimeter area of the display device in such a way as to enclose the display area DA. The locations of the display area DA and the non-display area NDA are not limited thereto, and the locations thereof may be changed.

The display area DA may be an area in which the pixels PXL for displaying an image are provided. The non-display area NDA may be an area in which the driver for driving the pixels PXL and some of the line component for electrically of coupling the pixels PXL to the driver are provided.

The display area DA may have various shapes. For example, the display area DA may be provided in various forms such as a closed polygon including sides formed of linear lines, a circle, an ellipse or the like including a side formed of a curved line, and a semicircle, a semi-ellipse or the like including sides formed of a linear line and a curved line.

The non-display area NDA may be provided in at least one side of the display area DA. In an embodiment, the non-display area NDA may enclose the perimeter of the display area DA.

The substrate SUB may include transparent insulating material to allow light transmission. The substrate SUB may be a rigid substrate. For example, the rigid substrate SUB may be one of a glass substrate, a quartz substrate, a glass ceramic substrate, and a crystalline glass substrate.

The substrate SUB may be a flexible substrate. Here, the flexible substrate SUB may be either a film substrate or a plastic substrate which includes polymer organic material. For example, the flexible substrate SUB may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

However, materials forming (or constituting) the substrate SUB may be changed, and include, for example, fiber reinforced plastic (FRP).

An area on the substrate SUB is provided as the display area DA in which the pixels PXL are disposed, and the other area thereof is provided as the non-display area NDA. For example, the substrate SUB may include the display area DA including pixel areas in which the respective pixels PXL are formed, and the non-display area NDA disposed around the display area DA.

The pixels PXL may be disposed in the display area DA on the substrate SUB. In an embodiment, the pixels PXL may be arranged in the display area DA in a stripe or a PenTile® arrangement structure, but the disclosure is not limited thereto. For example, the pixels PXL may be arranged in the display area DA in various arrangement manners.

Each pixel PXL may include a light emitting element LD configured to be driven in response to a corresponding scan signal and a corresponding data signal. The light emitting element LD may have a small size corresponding to the micrometer scale or the nanometer scale and be electrically connected in parallel to light emitting elements LD disposed adjacent thereto, but the disclosure is not limited thereto. The light emitting element LD may form a light source of each pixel PXL.

Each of the pixels PXL may include at least one light source which is driven by a predetermined control signal (e.g., a scan signal and a data signal) and/or a predetermined power supply (e.g., a first driving power supply and a second driving power supply). For example, each of the pixels PXL may include a light emitting element LD illustrated in each of the embodiments of FIGS. 1A to 1F, e.g., at least one subminiature rod-type light emitting element LD having a small size corresponding to the nanometer scale or the micrometer scale. However, in embodiments, the type of the light emitting element LD which may be used as a light source of the pixel PXL is not limited thereto.

In an embodiment, the color, the type, and/or the number of pixels PXL are not particularly limited. For example, the color of light emitted from each pixel PXL may be changed in various ways.

The driver may provide a signal to each pixel PXL through the line component and thus control the operation of the pixel PXL. In FIG. 2, the line component is omitted for the convenience sake of explanation.

The driver may include a scan driver configured to provide scan signals to the pixels PXL through scan lines, an emission driver configured to provide emission control signals to the pixels PXL through emission control lines, a data driver configured to provide data signals to the pixels PXL through data lines, and a timing controller. The timing controller may control the scan driver, the emission driver, and the data driver.

Figure 3A:
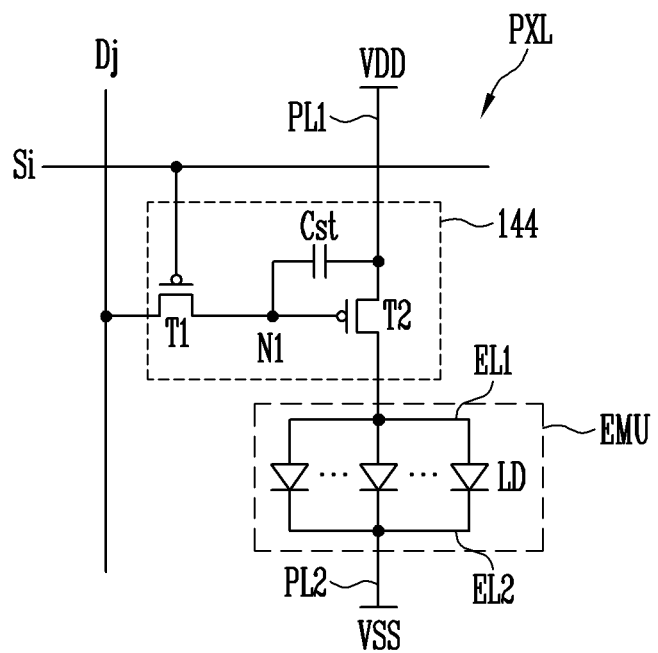
FIGS. 3A to 3C are circuit diagrams schematically illustrating various embodiments of electrical connection relationship of components included in any one pixel of the pixels illustrated in FIG. 2.
Figure 3B:
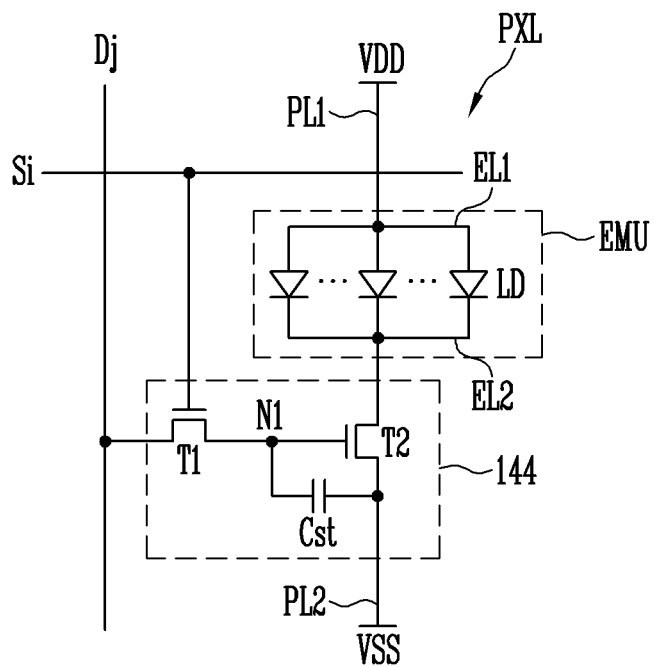
Figure 3C:
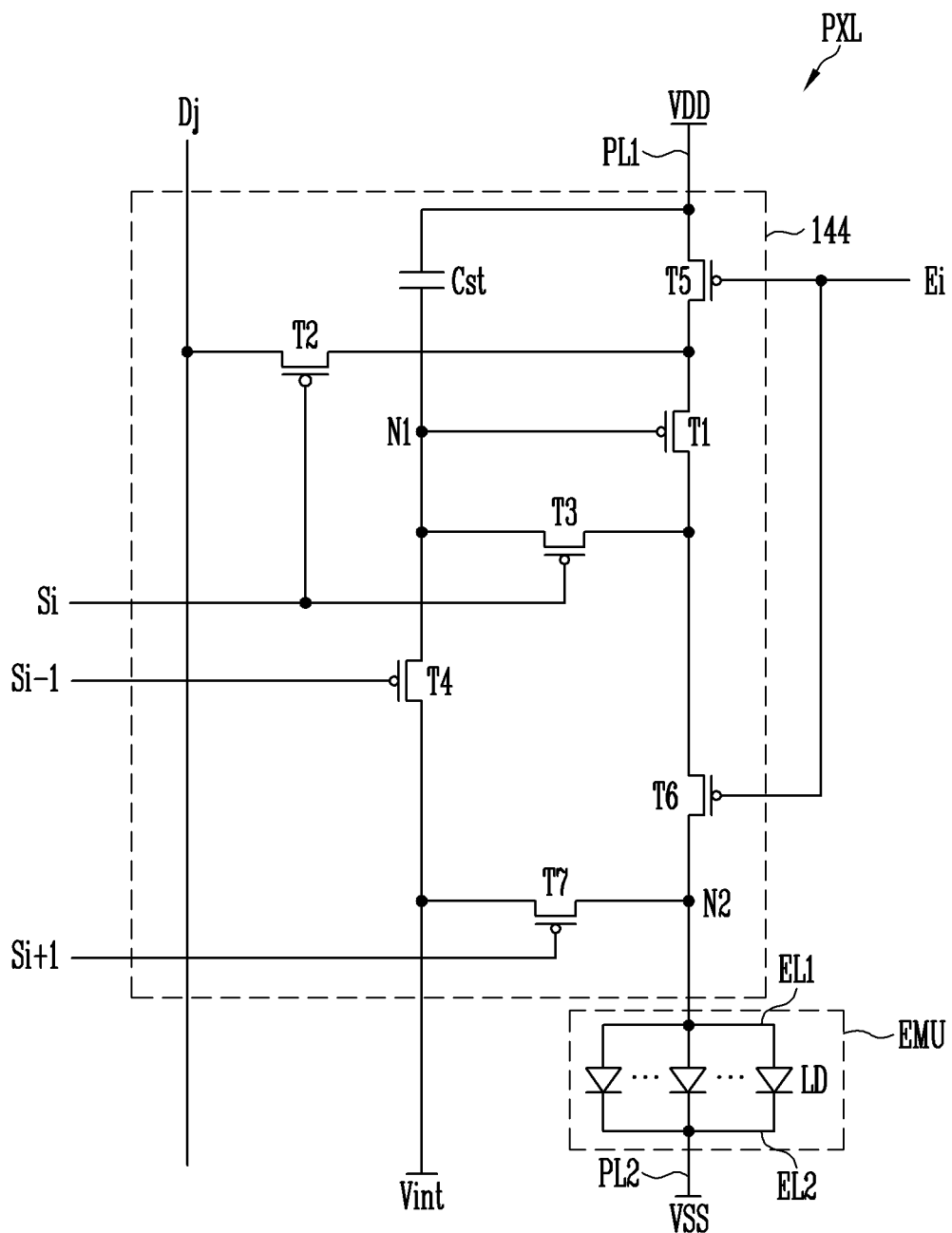

FIGS. 3A to 3C are circuit diagrams schematically illustrating various embodiments of electrical connection relationship of components included in any pixel of the pixels illustrated in FIG. 2.

For example, FIGS. 3A to 3C illustrate different embodiments of the electrical connection relationship of components included in a pixel PXL which may be employed in an active-matrix type display device. However, the types of the components included in the pixel PXL to which embodiments may be applied are not limited thereto.

In FIGS. 3A to 3C, not only the components included in each of the pixels PXL illustrated in FIG. 2 but also an area in which the components are provided is embraced in the definition of the term "pixel PXL." In an embodiment, each pixel PXL illustrated in FIGS. 3A to 3C may be any of the pixels PXL provided in the display device of FIG. 2. The pixels PXL may have substantially a same or similar structure.

Referring to FIGS. 1A to 1F, 2, and 3A to 3C, each pixel PXL may include an emission unit EMU configured to generate light having a luminance corresponding to a data signal. The pixel PXL may selectively further include a pixel circuit 144 configured to drive the emission unit EMU.

In an embodiment, the emission unit EMU may include light emitting elements LD electrically connected in parallel between a first power supply line PL1 to which a first driving power supply VDD is applied and a second power supply line PL2 to which a second driving power supply VSS is applied. For example, the emission unit EMU may include a first electrode EL1 (or "first alignment electrode") electrically connected to the first driving power supply VDD via the first power supply line PL1, a second electrode EL2 (or "second alignment electrode") electrically connected to the second driving power supply VSS through the second power supply line PL2, and light emitting elements LD electrically connected in parallel to each other in an identical direction between the first and second electrodes EL1 and EL2. In an embodiment, the first electrode EL1 may be an anode electrode, and the second electrode EL2 may be a cathode electrode.

In an embodiment, each of the light emitting elements LD included in the emission unit EMU may include a first end electrically connected to the first driving power supply VDD through the first electrode EL1, and a second end electrically connected to the second driving power supply VSS through the second electrode EL2. The first driving power supply VDD and the second driving power supply VSS may have different potentials. For example, the first driving power supply VDD may be set as a high-potential power supply, and the second driving power supply VSS may be set as a low-potential power supply. Here, a difference in potential between the first and second driving power supplies VDD and VSS may be set to a value equal to or greater than a threshold voltage of the light emitting elements LD during an emission period of the pixel PXL.

As described above, the light emitting elements LD that are electrically connected in parallel to each other in the same direction (e.g., in a forward direction) between the first electrode EL1 and the second electrode EL2 to which voltages having different potentials are respectively supplied may form respective valid light sources. The valid light sources may collectively form the emission unit EMU of the pixel PXL.

The light emitting elements LD of the emission unit EMU may emit light having a luminance corresponding to driving current supplied thereto through the pixel circuit 144. For example, during each frame period, the pixel circuit 144 may supply driving current corresponding to a gray scale of corresponding frame data to the emission unit EMU. The driving current supplied to the emission unit EMU may be divided into the light emitting elements LD electrically connected to each other in the identical direction. Hence, each of the light emitting elements LD may emit light having a luminance corresponding to current applied thereto, so that the emission unit EMU may emit light having a luminance corresponding to the driving current.

Although FIGS. 3A to 3C illustrate embodiments in which the light emitting elements LD are electrically connected to each other in the identical direction between the first and second driving power supplies VDD and VSS, the disclosure is not limited thereto. In an embodiment, the emission unit EMU may further include at least one invalid light source, as well as including the light emitting elements LD that form the respective valid light sources. For example, at least a reverse light emitting element (not shown) may be further electrically connected between the first and second electrodes EL1 and EL2 of the emission unit EMU. The reverse light emitting element, along with the light emitting elements LD that form the valid light sources, may be electrically connected in parallel to each other between the first and second electrodes EL1 and EL2. Here, the reverse light emitting element may be electrically connected between the first and second electrodes EL1 and EL2 in a direction opposite to that of the light emitting elements LD. Even in case that a predetermined driving voltage (e.g., a normal directional driving voltage) is applied between the first and second electrodes EL1 and EL2, the reverse light emitting element remains disabled. Hence, current substantially does not flow through the reverse light emitting element.

The pixel circuit 144 may be electrically connected to a scan line Si and a data line Dj of the corresponding pixel PXL. For example, if the pixel PXL is disposed in an i-th row (where i is a natural number) and a j-th column (where j is a natural number) of the display area DA, the pixel circuit 144 of the pixel PXL may be electrically connected to an i-th scan line Si and a j-th data line Dj of the display area DA. In an embodiment, the pixel circuit 144 may include first and second transistors T1 and T2, and a storage capacitor Cst, as illustrated in FIG. 3A. The structure of the pixel circuit 144 is not limited to that of the embodiment illustrated in FIG. 3A.

A first terminal of the first transistor T1 (or switching transistor) may be electrically connected to the data line Dj, and a second terminal thereof may be electrically connected to a first node N1. Here, the first terminal and the second terminal of the first transistor T1 are different from each other, and, for example, if the first terminal is a source electrode, the second terminal is a drain electrode. A gate electrode of the first transistor T1 may be electrically connected to the scan line Si.

In case that a scan signal having a voltage (e.g., a low-level voltage) capable of turning on the first transistor T1 is supplied from the scan line Si, the first transistor T1 is turned on to electrically connect the data line Dj with the first node N1. Here, a data signal of a corresponding frame is supplied to the data line Dj, whereby the data signal is transmitted to the first node N1. The data signal transmitted to the first node N1 may be storage into the storage capacitor Cst.

A first terminal of the second transistor T2 (or driving transistor) may be electrically connected to the first driving power supply VDD, and a second terminal thereof may be electrically connected to the first electrode EL1 for each of the light emitting elements LD. A gate electrode of the second transistor T2 may be electrically connected to the first node N1. As such, the second transistor T2 may control the amount of driving current to be supplied to the light emitting elements LD in response to the voltage of the first node N1.

A first electrode of the storage capacitor Cst may be electrically connected to the first driving power supply VDD, and a second electrode thereof may be electrically connected to the first node N1. The storage capacitor Cst is charged with a voltage corresponding to a data signal supplied to the first node N1, and maintains the charged voltage until a data signal of a subsequent frame is supplied.

FIG. 3A illustrates the pixel circuit 144 including the first transistor T1 configured to transmit a data signal to the pixel PXL, the storage capacitor Cst configured to store the data signal, and the second transistor T2 configured to supply driving current corresponding to the data signal to the light emitting elements LD.

However, the disclosure is not limited thereto, and the structure of the pixel circuit 144 may be changed in various ways. For example, the pixel circuit 144 may further include at least one transistor element such as a transistor element configured to compensate for the threshold voltage of the second transistor T2, a transistor element configured to initialize the first node N1, and/or a transistor element configured to control an emission time of the light emitting elements LD, or other circuit elements such as a boosting capacitor for boosting the voltage of the first node N1.

Furthermore, although in FIG. 3A the transistors, e.g., the first and second transistors T1 and T2, included in the pixel circuit 144 are illustrated as being formed of P-type transistors, the disclosure is not limited thereto. In other words, at least one of the first and second transistors T1 and T2 included in the pixel circuit 144 may be changed to an N-type transistor.

Next, referring to FIGS. 1A to 1F, 2, and 3B, the first and second transistors T1 and T2 in accordance with an embodiment may be formed of N-type transistors. The configuration and operation of the pixel circuit 144 illustrated in FIG. 3B, other than a change in connection positions of some components due to a change in the type of transistor, are similar to those of the pixel circuit 144 of FIG. 3A. Therefore, detailed descriptions pertaining to this will be omitted.

In an embodiment, the configuration of the pixel circuit 144 is not limited to the embodiments illustrated in FIGS. 3A and 3B. For example, the pixel circuit 144 may be configured in the same manner as that of an embodiment shown in FIG. 3C.

As illustrated in FIG. 3C, the pixel circuit 144 may be electrically connected to a scan line Si and a data line Dj of the pixel PXL. For example, if the pixel PXL is disposed in an i-th row and a j-th column of the display area DA, the pixel circuit 144 of the pixel PXL may be electrically connected to an i-th scan line Si and a j-th data line Dj of the display area DA.

In an embodiment, the pixel circuit 144 may also be electrically connected to at least one scan line. For example, the pixel PXL disposed in the i-th row of the display area DA may also be electrically connected to an i−1-th scan line Si−1 and/or an i+1-th scan line Si+1. In an embodiment, the pixel circuit 144 may be electrically connected not only to the first and second driving power supplies VDD and VSS but also to a third power supply. For example, the pixel circuit 144 may also be electrically connected to an initialization power supply Vint.

The pixel circuit 144 may include first to seventh transistors T1 to T7, and a storage capacitor Cst.

A first electrode, e.g., a source electrode, of the first transistor T1 (the driving transistor) may be electrically connected to the first driving power supply VDD via the fifth transistor T5, and a second electrode thereof, e.g., a drain electrode, may be electrically connected to one ends (or first ends) of light emitting elements LD via the sixth transistor T6. A gate electrode of the first transistor T1 may be electrically connected to a first node N1. The first transistor T1 may control driving current flowing between the first driving power supply VDD and the second driving power supply VSS via the light emitting elements LD in response to the voltage of the first node N1.

The second transistor T2 (the switching transistor) may be electrically connected between the j-th data line Dj electrically connected to the pixel PXL and the source electrode of the first transistor T1. A gate electrode of the second transistor T2 may be electrically connected to the i-th scan line Si electrically connected to the pixel PXL. In case that a scan signal having a gate-on voltage (e.g., a low-level voltage) is supplied from the i-th scan line Si, the second transistor T2 may be turned on to electrically connect the j-th data line Dj to the source electrode of the first transistor T1. Hence, if the second transistor T2 is turned on, a data signal supplied from the j-th data line Dj may be transmitted to the first transistor T1.

The third transistor T3 may be electrically connected between the drain electrode of the first transistor T1 and the first node N1. A gate electrode of the third transistor T3 may be electrically connected to the i-th scan line Si. In case that a scan signal having a gate-on voltage is supplied from the i-th scan line Si, the third transistor T3 may be turned on to electrically connect the drain electrode of the first transistor T1 to the first node N1.

The fourth transistor T4 may be electrically connected between the first node N1 and an initialization power supply line to which the initialization power supply Vint is to be applied. A gate electrode of the fourth transistor T4 may be electrically connected to a preceding scan line, e.g., the i−1-th scan line Si−1. In case that a scan signal having a gate-on voltage is supplied to the i−1-th scan line Si−1, the fourth transistor T4 may be turned on so that the voltage of the initialization power supply Vint may be transmitted to the first node N1. Here, the initialization power supply Vint may have a voltage equal to or less than the minimum voltage of the data signal.

The fifth transistor T5 may be electrically connected between the first driving power supply VDD and the first transistor T1. A gate electrode of the fifth transistor T5 may be electrically connected to a corresponding emission control line, e.g., an i-th emission control line Ei. The fifth transistor T5 may be turned off in case that an emission control signal having a gate-off voltage is supplied to the i-th emission control line Ei, and may be turned on in other cases.

The sixth transistor T6 may be electrically connected between the first transistor T1 and a second node N2, which is electrically connected to the first ends of the light emitting elements LD. A gate electrode of the sixth transistor T6 may be electrically connected to the i-th emission control line Ei. The sixth transistor T6 may be turned off in case that an emission control signal having a gate-off voltage is supplied to the i-th emission control line Ei, and may be turned on in other cases.

The seventh transistor T7 may be electrically connected between the first ends of the light emitting elements LD and the initialization power supply line to which the initialization power supply Vint is to be applied. A gate electrode of the seventh transistor T7 may be electrically connected to any one of scan lines of a subsequent stage, e.g., to the i+1-th scan line Si+1. In case that a scan signal having a gate-on voltage is supplied to the i+1-th scan line Si+1, the seventh transistor T7 may be turned on so that the voltage of the initialization power supply Vint may be supplied to the first ends of light emitting elements LD.

The storage capacitor Cst may be electrically connected between the first driving power supply VDD and the first node N1. The storage capacitor Cst1 may store a voltage corresponding both to a data signal applied to the first node N1 during each frame period and to the threshold voltage of the first transistor T1.

Although in FIG. 3C the transistors included in the pixel circuit 144, e.g., the first to seventh transistors T1 to T7, are illustrated as being formed of P-type transistors, the disclosure is not limited thereto. For example, at least one of the first to seventh transistors T1 to T7 may be changed to an N-type transistor.

Although FIGS. 3A to 3C illustrate embodiments in which all light emitting elements LD of each emission unit EMU are electrically connected in parallel to each other, the disclosure is not limited thereto. In an embodiment, the emission unit EMU may include at least one serial stage including light emitting elements LD electrically connected in series to each other. In other words, the emission unit EMU may be formed of a serial/parallel combination structure.

The structure of the pixel PXL which may be applied to the disclosure is not limited to the embodiments illustrated in FIGS. 3A to 3C, and the corresponding pixel PXL may have various structures. In an embodiment, each pixel PXL may be configured in a passive light emitting display device, or the like. In this case, the pixel circuit 144 may be omitted, and the opposite ends of the light emitting elements LD included in the emission unit EMU may be directly electrically connected to the scan lines Si−1, Si, and Si+1, the data line Dj, the first power supply line PL1 to which the first driving power supply VDD is to be applied, the second power supply line PL2 to which the second driving power supply VSS is to be applied, and/or a control line.

Figure 4:
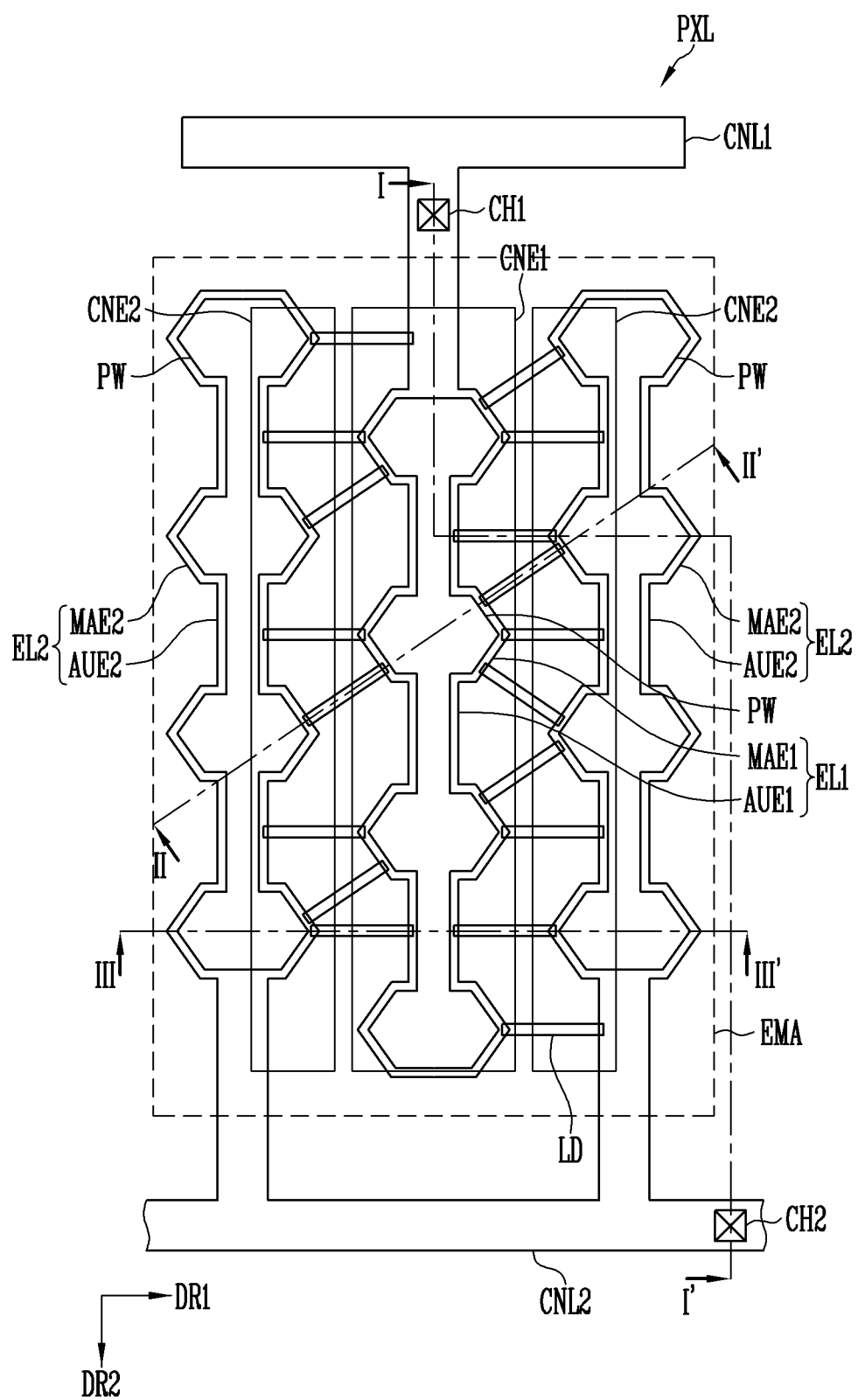
FIG. 4 is a plan view schematically illustrating a display element layer included in one pixel of the pixels shown in FIG. 2.
Figure 5:
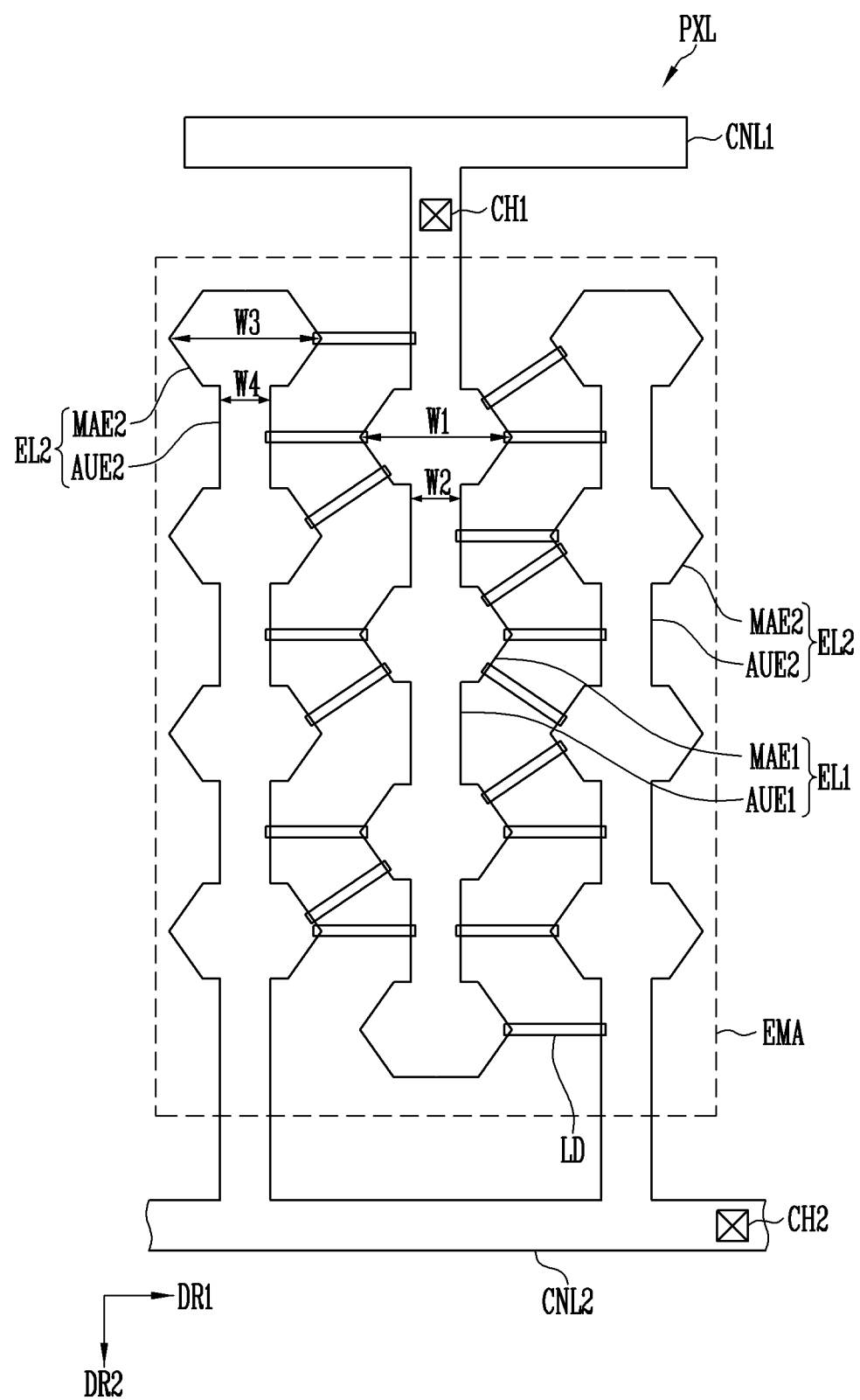
FIG. 5 is a plan view schematically illustrating only first and second electrodes of FIG. 4 and light emitting elements aligned therebetween.
Figure 6:
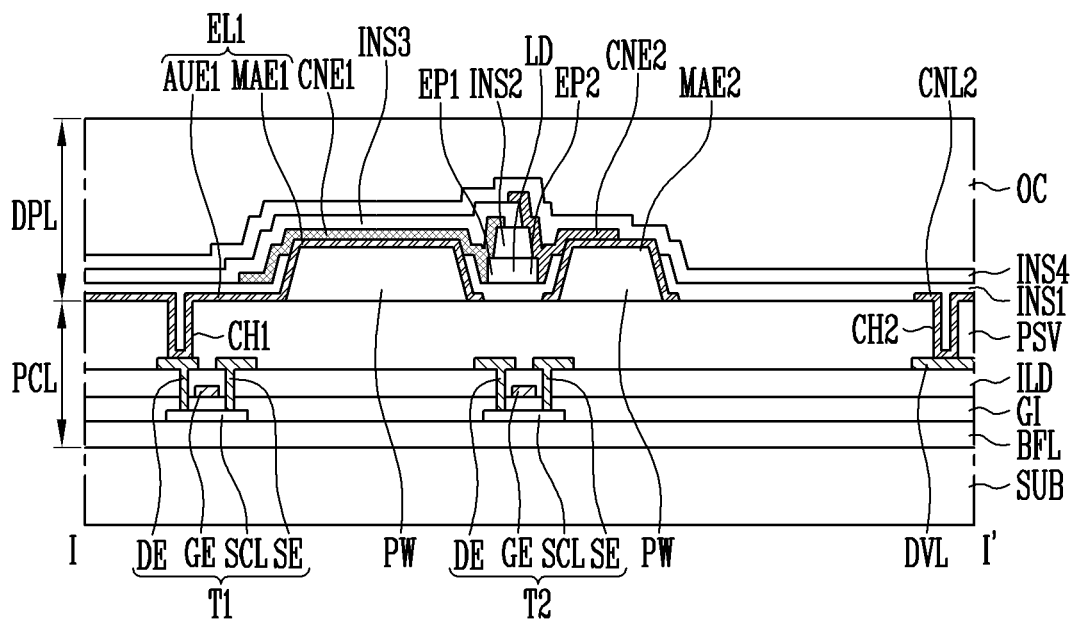
FIG. 6 is a schematic cross-sectional view taken along line I-I' of FIG. 4.
Figure 7:
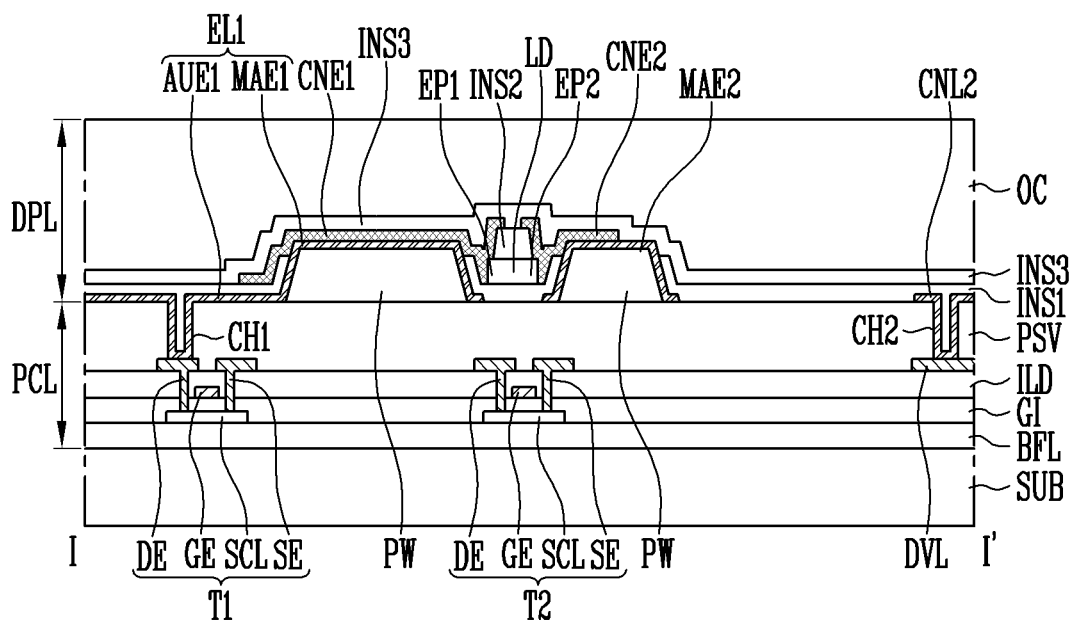
FIG. 7 schematically illustrates an embodiment in which the first and second contact electrodes shown in FIG. 6 are disposed on an identical layer, and is a cross-sectional view taken along line I-I' of FIG. 4.
Figure 8:
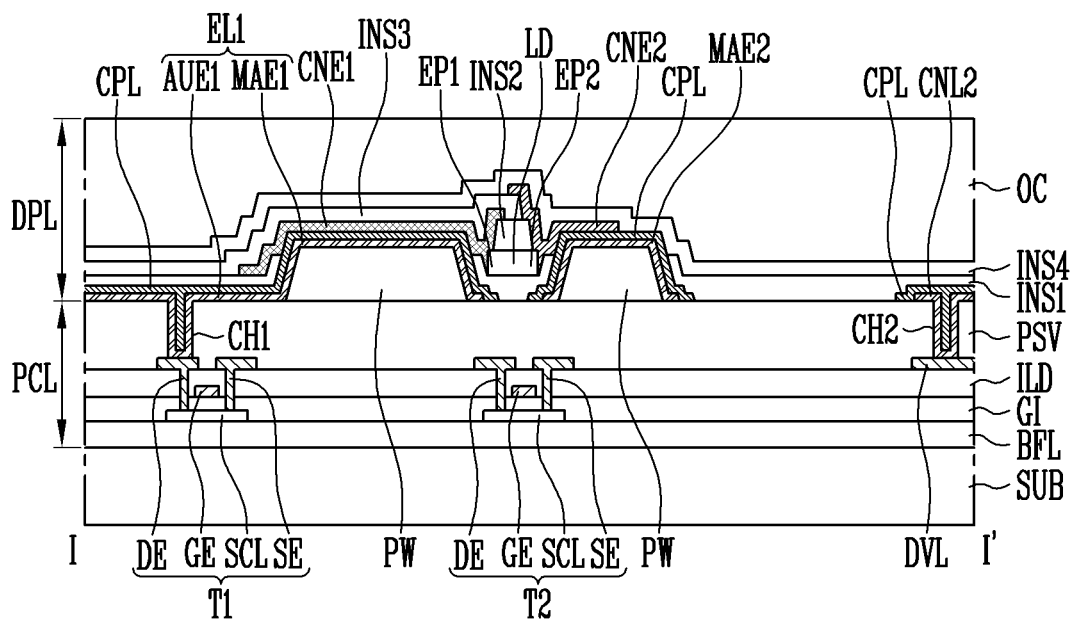
FIG. 8 schematically illustrates an embodiment in which capping layers are respectively disposed between the first electrode and the first contact electrode and between the second electrode and the second contact electrode shown in FIG. 6, and is a cross-sectional view taken along line I-I' of FIG. 4.
Figure 9:
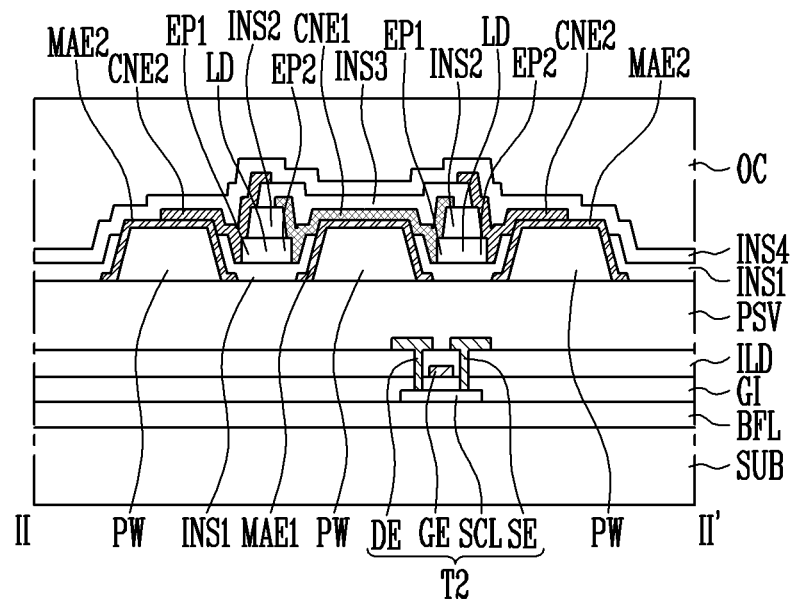
FIG. 9 is a schematic cross-sectional view taken along line II-II' of FIG. 4.
Figure 10:
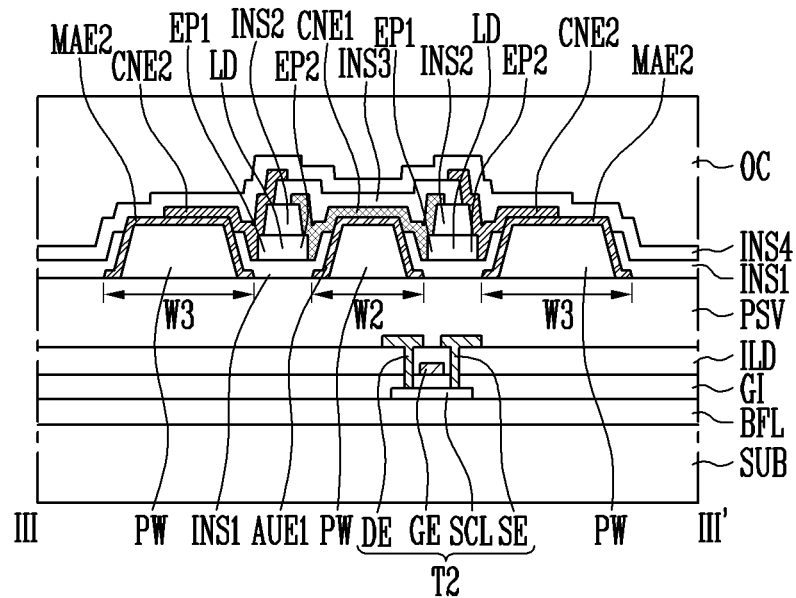
FIG. 10 is a schematic cross-sectional diagram taken along line III-III' of FIG. 4.
Figure 11:
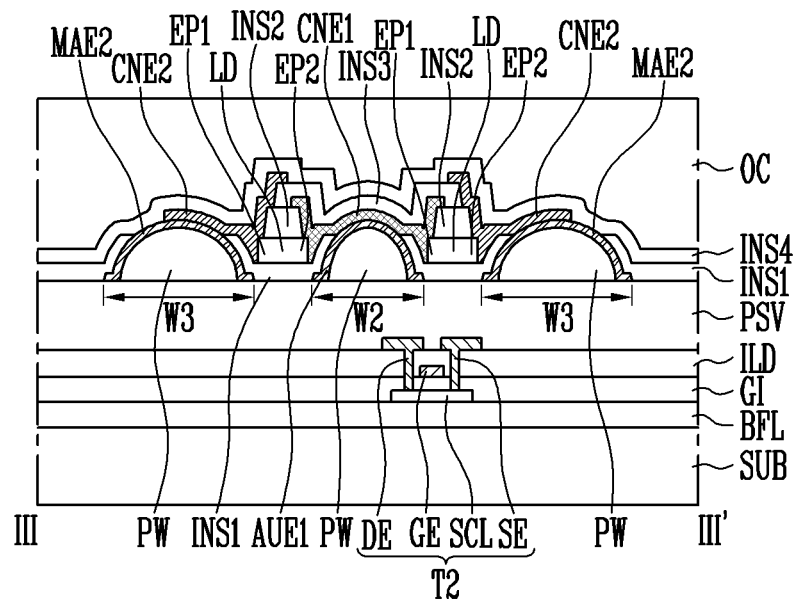
FIG. 11 illustrates another shape of a bank pattern illustrated in FIG. 10, and is a schematic cross-sectional view taken along line III-III' of FIG. 4.
Figure 12:
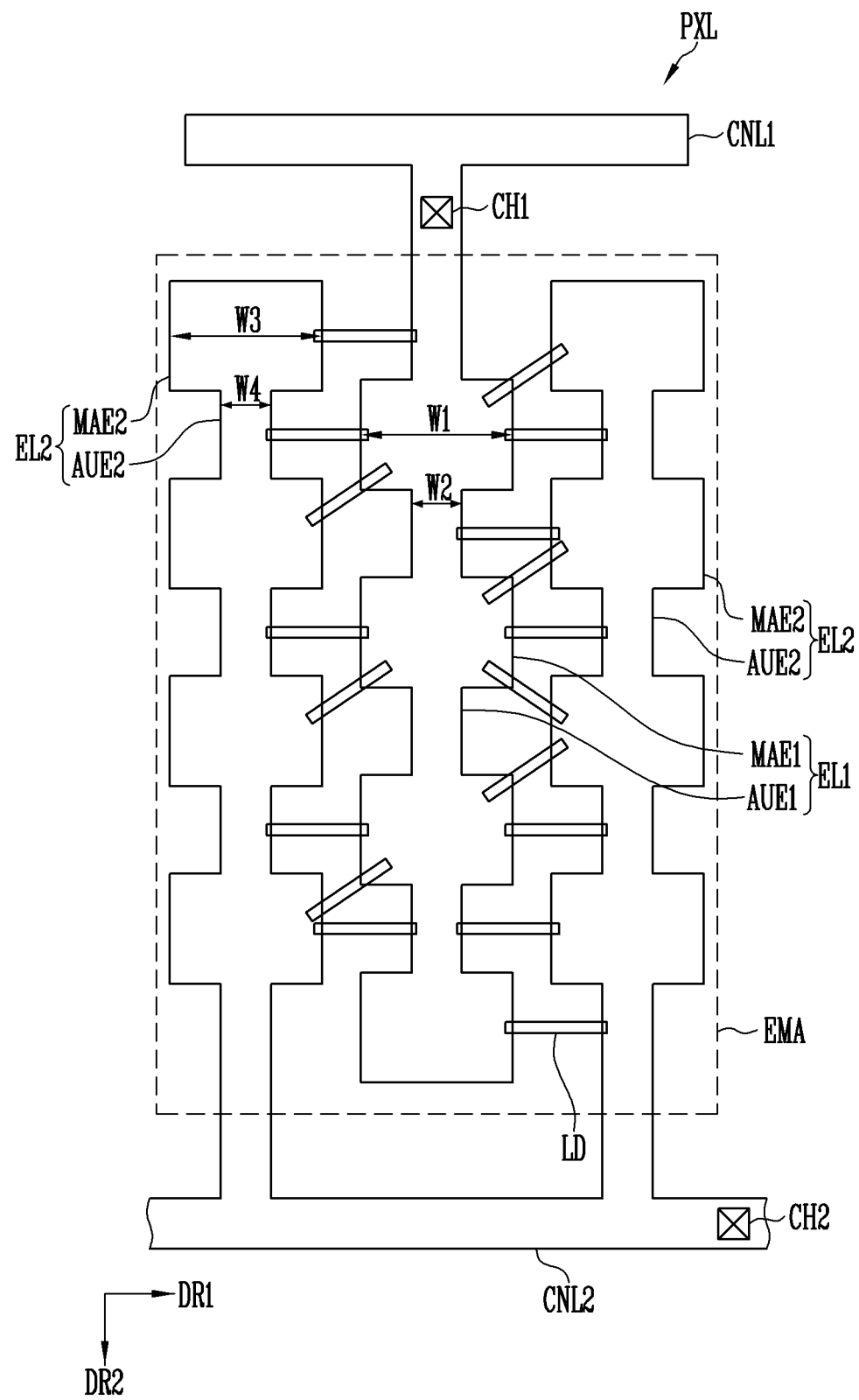
FIGS. 12 to 19 illustrate other embodiments of the pixel of FIG. 4, and are plan views schematically illustrating a pixel including only some components of the display element layer.
Figure 13:
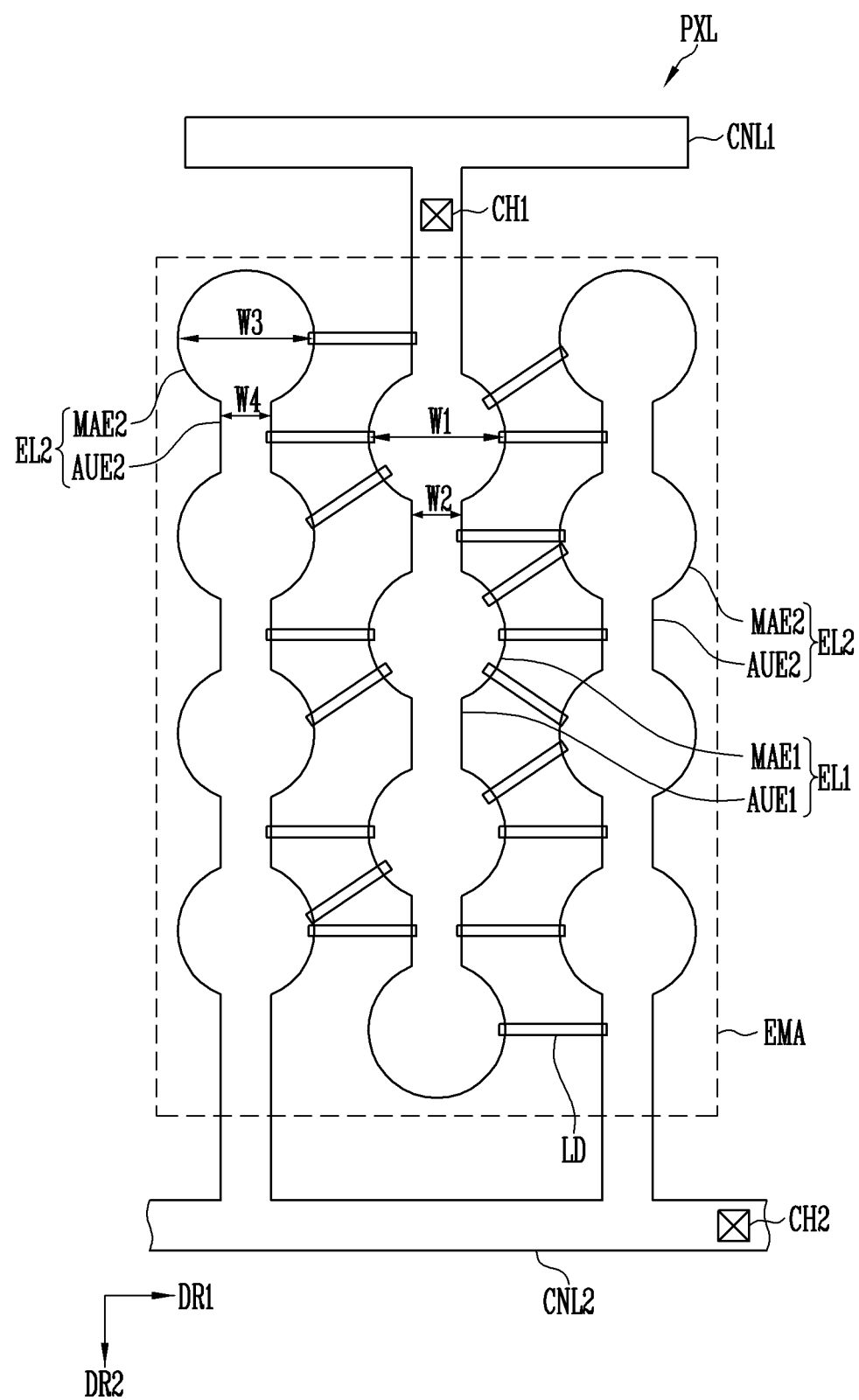
Figure 14:
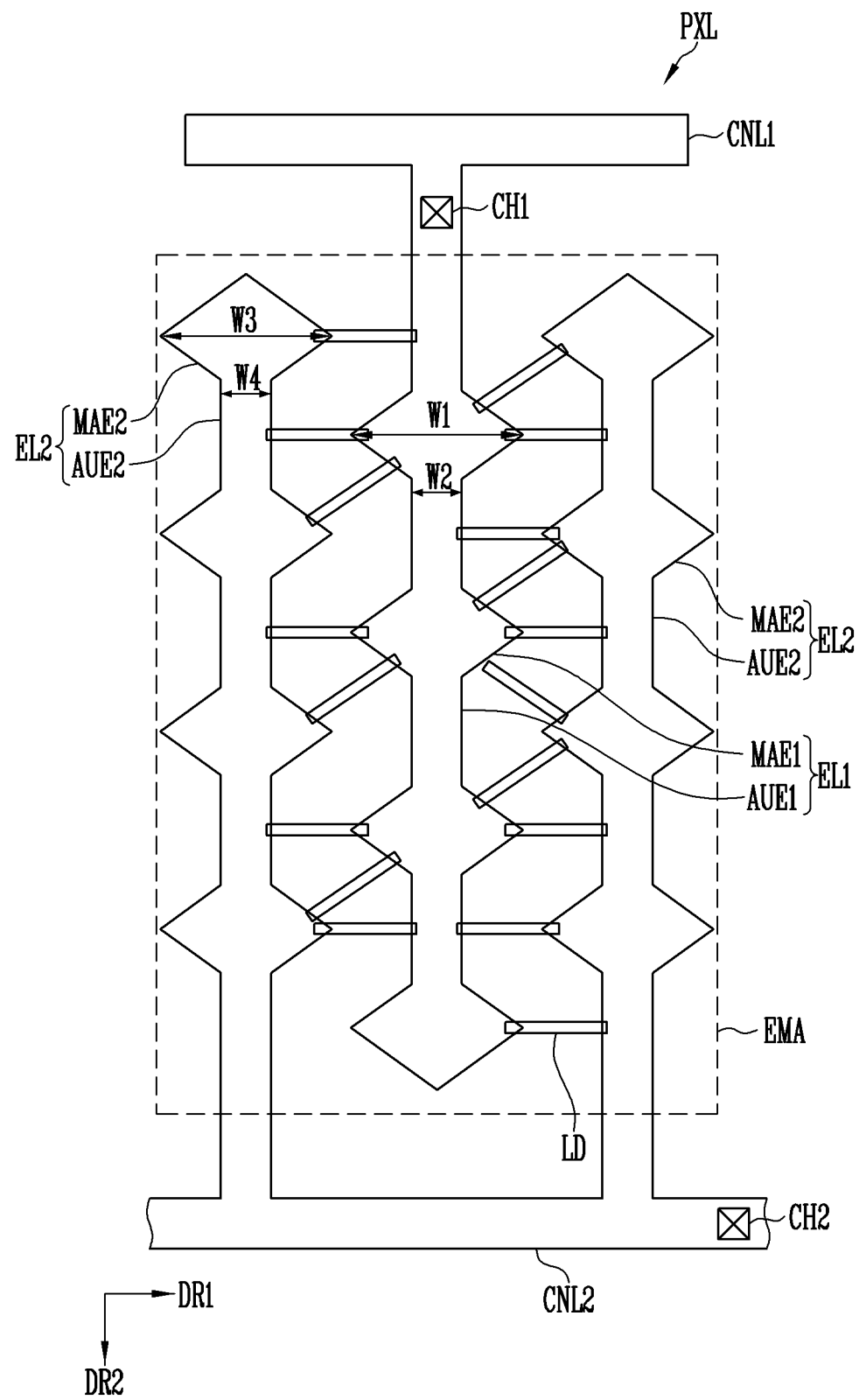
Figure 15:
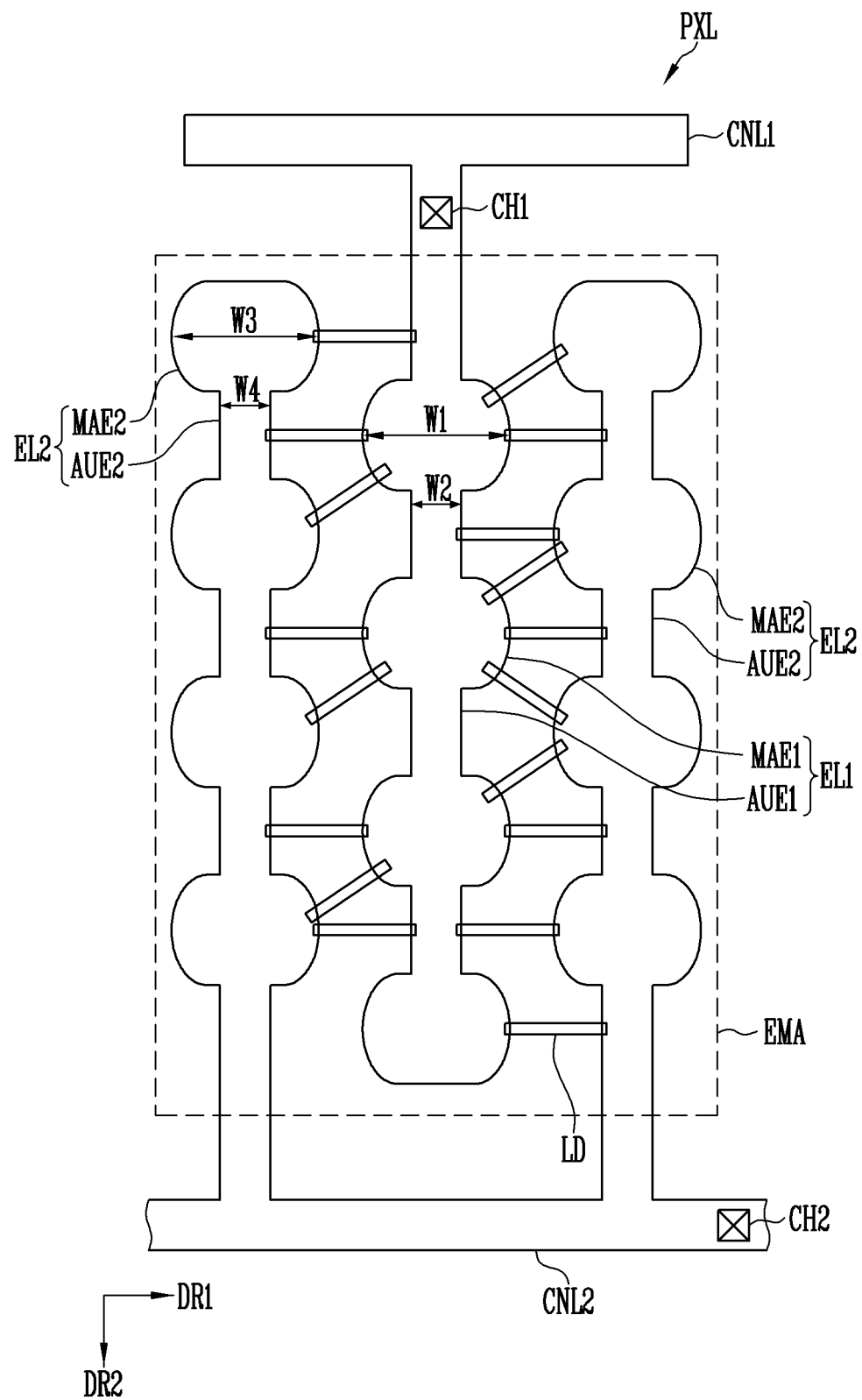

FIG. 4 is a plan view schematically illustrating a display element layer included in a pixel shown in FIG. 2. FIG. 5 is a schematic plan view illustrating first and second electrodes of FIG. 4 and light emitting elements aligned therebetween. FIG. 6 is schematic a cross-sectional view taken along line I-I' of FIG. 4. FIG. 7 illustrates an embodiment in which the first and second contact electrodes shown in FIG. 6 are disposed on an identical layer, and is a schematic cross-sectional view taken along line I-I' of FIG. 4. FIG. 8 illustrates an embodiment in which capping layers are respectively disposed between the first electrode and the first contact electrode and between the second electrode and the second contact electrode shown in FIG. 6, and is a schematic cross-sectional view taken along line I-I' of FIG. 4. FIG. 9 is a schematic cross-sectional view taken along line II-II' of FIG. 4. FIG. 10 is a schematic cross-sectional view taken along line III-III' of FIG. 4. FIG. 11 illustrates another shape of a bank pattern illustrated in FIG. 10, and is a schematic cross-sectional view taken along line III-III' of FIG. 4.

For the sake of explanation, illustration of transistors electrically connected to the light emitting elements, and signal lines electrically connected to the transistors are omitted in FIG. 4.

Although FIGS. 4 to 11 illustrate a simplified structure of a pixel, e.g., showing that each electrode has only a single electrode layer, and each insulating layer has only a single insulating layer, the disclosure is not limited thereto.

In an embodiment of the disclosure, the words "components are provided and/or formed on the same layer" may mean that the components are formed by an identical process.

Referring to FIGS. 1A to 11, the display device in accordance with an embodiment of the disclosure may include a substrate SUB, a line component, and pixels PXL.

Each of the pixels PXL may be provided in the substrates SUB, and include an emission area EMA which emits light, and a peripheral area disposed around the emission area EMA. In an embodiment, the emission area EMA may mean an area from which light is emitted, and the peripheral area may refer to an area from which the light is not emitted. The pixel area of each of the pixels PXL may include an emission area EMA of the corresponding pixel PXL, and a peripheral area formed therearound.

The substrate SUB, the pixel circuit layer PCL, and the display element layer DPL may be provided and/or formed in the pixel area of each of the pixels PXL.

The substrate SUB may include transparent insulating material and thus allow light to pass therethrough. The substrate SUB may be a rigid substrate or a flexible substrate.

Material applied to the substrate SUB may have resistance (thermal resistance) to high treatment temperatures during a process of fabricating the display device. In an embodiment, the entirety or at least a portion of the substrate SUB may have flexibility.

The pixel circuit layer PCL may include at least one transistor provided and/or formed on the buffer layer BFL, a driving voltage line DVL, and a passivation layer PSV configured to cover (or overlap) the transistor and the driving voltage line DVL.

The buffer layer BFL may prevent impurities from diffusing into the transistor. The buffer layer BFL may be provided in a single layer structure or a multilayer structure having at least two or more layers. In case that the buffer layer BFL has a multilayer structure, the respective layers may be formed of an identical material or different materials. The buffer layer BFL may be omitted depending on the material of the substrate SUB and/or processing conditions.

The transistor may include a first transistor T1 and a second transistor T2. In an embodiment, the first transistor T1 may be a driving transistor electrically connected to light emitting elements LD of a corresponding pixel PXL and configured to drive the light emitting elements LD. The second transistor T2 may be a switching transistor configured to switch the first transistor T1.

Each of the first and second transistors T1 and T2 may include a semiconductor layer SCL, a gate electrode GE, and first and second terminals SE and DE. The first terminal SE may be either a source electrode or a drain electrode, and the second terminal DE may be the other electrode of the source electrode and the drain electrode. For example, in case that the first terminal SE is the source electrode, the second terminal DE may be the drain electrode.

The semiconductor layer SCL may be disposed on the buffer layer BFL. The semiconductor layer SCL may include a first area which contacts the first terminal SE, and a second area which contacts the second terminal DE. An area between the first area and the second area may be a channel area.

The semiconductor layer SCL may be a semiconductor pattern formed of polysilicon, amorphous silicon, an oxide semiconductor, etc. The channel area may be an intrinsic semiconductor, which is an undoped semiconductor pattern. Each of the source area and the drain area may be a semiconductor pattern doped with an impurity.

The gate electrode GE may be provided on the semiconductor layer SCL with the gate insulating layer GI interposed therebetween.

The first terminal SE and the second terminal DE may respectively come into contact with the first area and the second area of the semiconductor layer SCL through corresponding contact holes (or via holes) that pass through an interlayer insulating layer ILD and the gate insulating layer GI. Each of the first terminal SE and the second terminal DE may include conductive material and be formed of a single layer or multiple layers.

In an embodiment, at least one transistor included in the pixel circuit layer PCL of each of the pixels PXL may be formed of a low-temperature polycrystalline silicon (LTPS) thin-film transistor, but the disclosure is not limited thereto. In some embodiments, the at least one transistor may be formed of an oxide semiconductor thin-film transistor. Furthermore, in an embodiment, there has been illustrated the case where the transistor is a thin film transistor having a top gate structure, but the disclosure is not limited thereto. In an embodiment, the transistor may be a thin film transistor having a bottom gate structure.

The driving voltage line DVL may be provided on the interlayer insulating layer ILD, but the disclosure is not limited thereto. In some embodiments, the driving voltage line DVL may be provided on one of insulating layers included in the pixel circuit layer PCL. A voltage of the second driving power supply VSS may be applied to the driving voltage line DVL. In an embodiment, the driving voltage line DVL may be the second power line PL2 to which the voltage of the second driving power supply VSS is applied, as illustrated in each of FIGS. 3A to 3C.

The passivation layer PSV may include a first contact hole CH1 which exposes a portion of the second terminal DE of the first transistor T1, and a second contact hole CH2 which exposes a portion of the driving voltage line DVL.

The passivation layer PSV may be provided in the form of an organic insulating layer, an inorganic insulating layer, or a structure including the organic insulating layer disposed on the inorganic insulating layer. The inorganic insulating layer may include at least one of silicon oxide ($SiO_x$) and silicon nitride ($SiN_x$). The organic insulating layer may include organic insulating material allowing light to pass therethrough. The organic insulating layer may include, for example, at least one of polyacrylates resin, epoxy resin, phenolic resin, polyamides resin, polyimides rein, unsaturated polyesters resin, polyphenylene ethers resin, polyphenylene sulfides resin, and benzocyclobutene resin.

The display element layer DPL of each of the pixels PXL may include a bank pattern PW, first and second electrodes EL1 and EL2, light emitting elements LD, and first and second connection lines CNL1 and CNL2. The display element layer DPL of each of the pixels PXL may selectively further include at least one first contact electrode CNE1 which is directly electrically connected to the first electrode EL1, and at least one second contact electrode CNE2 which is directly electrically connected to the second electrode EL2.

The bank pattern PW may be provided and/or formed on the passivation layer PSV of the emission area EMA of each of the pixels PXL. The bank pattern PW may include an inorganic insulating layer formed of inorganic material or an organic insulating layer formed of organic material. In an embodiment, the bank pattern PW may include an organic insulating layer having a single layer structure and/or an inorganic insulating layer having a single layer structure, but the disclosure is not limited thereto. For example, the bank pattern PW may have a multi-layer structure formed by stacking at least one or more organic insulating layers and at least one or more inorganic insulating layers.

The bank pattern PW may have a trapezoidal cross-section the width of which reduces from a surface of the passivation layer PSV upward, but the disclosure is not limited thereto. In an embodiment, the bank pattern PW may include a curved surface having a cross-section having a semi-elliptical shape, a semi-circular shape, etc., the width of which reduces upward from a surface of the passivation layer PSV, as illustrated in FIG. 11. In a cross-sectional view, the shape of the bank pattern PW is not limited to the foregoing examples, and may be changed in various ways within a range in which the efficiency of light emitted from each of the light emitting elements LD can be enhanced.

The adjacent bank patterns PW may be disposed on the same plane on the passivation layer PSV and have the same height. In an embodiment, the adjacent bank patterns PW may have different widths. Detailed descriptions thereof will be made below with reference to descriptions of the first and second electrodes EL1 and EL2.

The display element layer DPL of each of the pixels PXL may further include a bank (not illustrated) disposed to enclose the emission area EMA of each pixel PXL, in the peripheral area (e.g., a non-emission area in which the light emitting elements LD are not aligned) of the corresponding pixel PXL. The bank may be a structure configured to define (or partition) each emission area EMA and, for example, may be a pixel defining layer. The bank may include at least one light shielding material and/or at least one light reflective material and thus prevent a light leakage defect, in which light (or rays) leaks between adjacent pixels PXL, from occurring.

In an embodiment, a reflective material layer may be formed on the bank so as to further enhance the efficiency of light emitted from each of the pixels PXL. Although the bank may be formed and/or provided on a layer identical with that of the bank pattern PW, the present disclosure is not limited thereto. In an embodiment, the bank may be formed and/or provided on a layer different from that of the bank pattern PW. In case that the bank is formed and/or provided on a layer (or a plane) identical with that of the bank pattern PW, the bank and the bank pattern PW may include the same material, but the disclosure is not limited thereto. In an embodiment, the bank and the bank pattern PW may include different materials.

The first connection line CNL1 may extend in a first direction DR1 (e.g., a "row direction") of each of the pixels PXL. The first connection line CNL1 may be provided and/or formed, to independently drive one pixel PXL from adjacent pixels PXL, in only the corresponding pixel PXL, and mat be electrically and/or physically separated from the first connection line CNL1 provided and/or formed in each of the adjacent pixels PXL.

The second connection line CNL2 may extend in a direction parallel to a direction in which the first connection line CNL1 extends. The second connection line CNL2 may be provided in common to adjacent pixels PXL. Hence, pixels PXL disposed in the same pixel row in the first direction DR1 may be electrically connected in common to the second connection line CNL2. The second connection line CNL2 may be electrically connected to the driving voltage line DVL of the pixel circuit layer PCL of each of the pixels PXL through the second contact hole CH2 that passes through the passivation layer PSV. Hence, the voltage of the second driving power supply VSS that is applied to the driving voltage line DVL may be transmitted to the second connection line CNL2 of the corresponding pixel PXL.

Each of the first and second electrodes EL1 and EL2 may be provided in the emission area EMA of each of the pixels PXL and extend in the second direction DR2 (e.g., a "column direction"). The first and second electrodes EL1 and EL2 may be provided on the same plane and spaced apart from each other by a predetermined distance.

The first electrode EL1 and the first connection line CNL1 may be integrally provided and electrically and/or physically connected to each other. In case that the first electrode EL1 and the first connection line CNL1 are integrally formed and/or provided, the first connection line CNL1 may be a predetermined area of the first electrode EL1, or the first electrode EL1 may be a predetermined area of the first connection line CNL1. The first electrode EL1 may diverge from the first connection line CNL1 in the second direction DR2.

In an embodiment, the first connection line CNL1 may be electrically connected to the first transistor T1 of the pixel circuit layer PCL of each of the pixels PXL through the first contact hole CH1 that passes through the passivation layer PSV. Hence, a signal (or a voltage) applied to the first transistor T1 may be transmitted to the first connection line CNL1 of the corresponding pixel PXL. As described above, since the first connection line CNL1 is integrally provided and/or formed with the first electrode EL1, a signal (or a voltage) applied to the first connection line CNL1 may be transmitted to the first electrode EL1.

In an embodiment, the first electrode EL1 may include first main electrodes MAE1 and first auxiliary electrodes AUE1.

Each of the first main electrodes MAE1 may be spaced apart from an adjacent first main electrode MAE1 in the second direction DR2. Although each of the first main electrodes MAE1 may have a hexagonal shape in a plan view, the shape of the first main electrodes MAE1 is not limited thereto.

Each of the first auxiliary electrodes AUE1 may be disposed between two first main electrodes MAE1 disposed adjacent thereto in the second direction DR2, and function as a bridge for electrically connecting the two first main electrodes MAE1 to each other. Although each of the first auxiliary electrodes AUE1 may have a rectangular shape in a plan view, the shape of the first auxiliary electrodes AUE1 is not limited thereto.

In an embodiment, the first main electrodes MAE1 and the first auxiliary electrodes AUE1 may be provided integrally with each other and be electrically and/or physically connected to each other. In case that the first main electrodes MAE1 and the first auxiliary electrodes AUE1 are formed and/or provided integrally with each other, the first auxiliary electrodes AUE1 may be respective predetermined areas of the first main electrodes MAE1.

Although in the foregoing embodiment the first main electrodes MAE1 and the first auxiliary electrodes AUE1 are formed and/or provided integrally with each other, the disclosure is not limited thereto. In an embodiment, the first main electrodes MAE1 and the first auxiliary electrodes AUE1 may be formed separately from each other and electrically connected to each other through a contact hole or a connector, which is not shown.

The first main electrodes MAE1 and the first auxiliary electrodes AUE1 may overlap one end (of first end) of the opposite ends EP1 and EP2 of each of the light emitting elements LD and directly contact the one end, and may thus be electrically and/or physically connected to each of the light emitting elements LD. However, the disclosure is not limited thereto. For example, the first main electrodes MAE1 and the first auxiliary electrodes AUE1 may be electrically and/or physically connected to any one end of the opposite ends EP1 and EP2 of each of the light emitting elements LD through the first contact electrode CNE1.

In an embodiment, a width W1 of each of the first main electrodes MAE1 may be greater than a width W2 of each of the first auxiliary electrodes AUE1. Here, the width W1 of each of the first main electrodes MAE1 and the width W2 of each of the first auxiliary electrodes AUE1 may refer to a width extending in the first direction DR1 (or the horizontal direction).

The width W1 of each of the first main electrodes MAE1 may be approximately 10 The width W2 of each of the first auxiliary electrodes AUE1 may be approximately 3 Here, the present disclosure is not limited to the foregoing embodiment. In an embodiment, the width W2 of each of the first auxiliary electrodes AUE1 may be greater than the width W1 of each of the first main electrodes MAE1.

The bank pattern PW may be provided and/or formed under each of the first main electrodes MAE1 and the first auxiliary electrodes AUE1. Each of the first main electrodes MAE1 and the first auxiliary electrodes AUE1 may overlap the bank pattern PW disposed thereunder. In an embodiment, a width of the bank pattern PW disposed under each of the first main electrodes MAE1 may differ from a width of the bank pattern PW disposed under each of the first auxiliary electrodes AUE1. In detail, the width of the bank pattern PW disposed under each of the first main electrodes MAE1 may be greater than the width of the bank pattern PW disposed under each of the first auxiliary electrodes AUE1.

Hereinafter, for the sake of explanation, the bank pattern PW disposed under each of the first main electrodes MAE1 may be referred to as a 1-1-th bank pattern PW, and the bank pattern PW disposed under each of the first auxiliary electrodes AUE1 may be referred to as a 1-2-th bank pattern PW.

Each of the first main electrodes MAE1 may have a surface profile corresponding to the shape of the 1-1-th bank pattern PW disposed thereunder. Each of the first auxiliary electrodes AUE1 may have a surface profile corresponding to the shape of the 1-2-th bank pattern PW disposed thereunder.

Furthermore, each of the first main electrodes MAE1 may have a surface area broad (or large) enough to completely cover (or overlap) the 1-1-th bank pattern PW. Each of the first auxiliary electrodes AUE1 may have a surface area broad (or large) enough to completely cover the 1-2-th bank pattern PW. For example, the width W1 of each of the first main electrodes MAE1 may be greater than a width of the 1-1-th bank pattern PW in the first direction DR1. The width W2 of each of the first auxiliary electrodes AUE1 may be greater than a width of the 1-2-th bank pattern PW in the first direction DR1. Here, the disclosure is not limited to the foregoing embodiment. In an embodiment, the width W1 of each of the first main electrodes MAE1 may be equal to or less than the width of the 1-1-th bank pattern PW in the first direction DR1. The width W2 of each of the first auxiliary electrodes AUE1 may be equal to or less than the width of the 1-2-th bank pattern PW with in the first direction DR1.

As described above, the first main electrodes MAE1 and the first auxiliary electrodes AUE1 that are integrally formed and/or provided and electrically and/or physically connected may form the first electrode EL1 of each of the pixels PXL. Because of the first main electrodes MAE1 and the first auxiliary electrodes AUE1, the width of the first electrode EL1 in the first direction DR1 may not be constant in a direction in which the first electrode EL1 extends. In other words, the first electrode EL1 may have at least two widths W1 and W2 in the extension direction thereof, e.g., in the second direction DR2.

In an embodiment, the second electrode EL2 may include second main electrodes MAE2 and second auxiliary electrodes AUE2.

Each of the second main electrodes MAE2 may be spaced apart from an adjacent second main electrode MAE2 in the second direction DR2. Each of the second main electrodes MAE2 may have a shape identical with that of the first main electrodes MAE1, but the disclosure is not limited thereto, and it may have a shape different from that of the first main electrodes MAE1.

Each of the second auxiliary electrodes AUE2 may be disposed between two second main electrodes MAE2 disposed adjacent thereto in the second direction DR2, and function as a bridge for electrically connecting the two second main electrodes MAE2 to each other. Each of the second auxiliary electrodes AUE2 may have a shape identical with that of the first auxiliary electrodes AUE1, but the disclosure is not limited thereto, and it may have a shape different from that of the first auxiliary electrodes AUE1.

In an embodiment, the second main electrodes MAE2 and the second auxiliary electrodes AUE2 may be provided integrally with each other, and electrically and/or physically connected to each other. In case that the second main electrodes MAE2 and the second auxiliary electrodes AUE2 are formed and/or provided integrally with each other, the second auxiliary electrodes AUE2 may be respective predetermined areas of the second main electrodes MAE2.

Although in the foregoing embodiment the second main electrodes MAE2 and the second auxiliary electrodes AUE2 are formed and/or provided integrally with each other, the disclosure is not limited thereto. In an embodiment, the second main electrodes MAE2 and the second auxiliary electrodes AUE2 may be formed separately from each other and electrically connected to each other through a contact hole or a connector, which is not shown.

A width W3 of each of the second main electrodes MAE2 may be identical with the width W1 of each of the first main electrodes MAE1. A width W4 of each of the second auxiliary electrodes AUE2 may be identical with the width W2 of each of the first auxiliary electrodes AUE1. Here, the disclosure is not limited to the foregoing embodiment, and in an embodiment, each of the second main electrodes MAE2 may have a width W3 different from the width W1 of each of the first main electrodes MAE1, and the width W4 of each of the second auxiliary electrodes AUE2 may be different from the width W2 of each of the first auxiliary electrodes AUE2.

The bank pattern PW may be provided and/or formed under each of the second main electrodes MAE2 and the second auxiliary electrodes AUE2. Each of the second main electrodes MAE2 and the second auxiliary electrodes AUE2 may overlap the bank pattern PW disposed thereunder.

In an embodiment, a width of the bank pattern PW disposed under each of the second main electrodes MAE2 may differ from a width of the bank pattern PW disposed under each of the second auxiliary electrodes AUE2. The width of the bank pattern PW disposed under each of the second main electrodes MAE2 may be identical with the width of the 1-1-th bank pattern PW. The width of the bank pattern PW disposed under each of the second auxiliary electrodes AUE2 may be identical with the width of the 1-2-th bank pattern PW. Here, the disclosure is not limited thereto. In an embodiment, the bank pattern PW disposed under each of the second main electrodes MAE2 may have a width different from that of the 1-1-th bank pattern PW, and the bank pattern PW disposed under each of the second auxiliary electrodes AUE2 may have a width different from that of the 1-2-th bank pattern PW.

Each of the second main electrodes MAE2 may have a surface profile corresponding to the shape of the bank pattern PW disposed thereunder. Each of the second auxiliary electrodes AUE2 may have a surface profile corresponding to the shape of the bank pattern PW disposed thereunder. Furthermore, each of the second main electrodes MAE2 may have a surface area (or size) broad (or large) enough to completely cover (or overlap) the bank pattern PW disposed thereunder. Each of the second auxiliary electrodes AUE2 may have a surface area (or size) broad (or large) enough to completely cover the bank pattern PW disposed thereunder.

The second main electrodes MAE2 and the second auxiliary electrodes AUE2 may overlap a remaining end of the opposite ends EP1 and EP2 of each of the light emitting elements LD and directly contact the remaining end, and may thus be electrically and/or physically connected to each of the light emitting elements LD. However, the disclosure is not limited thereto. For example, the second main electrodes MAE2 and the second auxiliary electrodes AUE2 may be electrically and/or physically connected to the remaining end of the opposite ends EP1 and EP2 of each of the light emitting elements LD through the second contact electrode CNE2.

As described above, the second main electrodes MAE2 and the second auxiliary electrodes AUE2 that are integrally formed and/or provided and electrically and/or physically connected may form the second electrode EL2 of each of the pixels PXL. Because of the second main electrodes MAE2 and the second auxiliary electrodes AUE2, the width of the second electrode EL2 in the first direction DR1 may not be constant in a direction in which the second electrode EL2 extends. In other words, the second electrode EL2 may have at least two widths W3 and W4 in the extension direction thereof, e.g., in the second direction DR2.

In an embodiment, in a plan view, the first electrode EL1 and the second electrode EL2 may be alternately disposed on the pixel circuit layer PCL of the corresponding pixel PXL. For example, each of the first main electrodes MAE1 of the first electrode EL1 may alternate with each of the second auxiliary electrodes AUE2 of the second electrode EL2 in the first direction DR1 (or the row direction). Each of the first auxiliary electrodes AUE1 of the first electrode EL1 may alternate with each of the second main electrodes MAE2 of the second electrode EL2 in the first direction DR1.

In other words, each of the first main electrodes MAE1 may be provided in a row identical with that of each of the second auxiliary electrodes AUE2 in the first direction DR1 and correspond to each of the second auxiliary electrodes AUE2. Each of the second main electrodes MAE2 may be provided in a row identical with that of each of the first auxiliary electrodes AUE1 in the first direction DR1 and correspond to each of the first auxiliary electrodes AUE1. However, the disclosure is not limited thereto. In an embodiment, each of the first main electrodes MAE1 may be provided in a row identical with that of each of the second main electrodes MAE2 in the first direction DR1 and correspond to each of the second main electrodes MAE2. Each of the first auxiliary electrodes AUE1 may be provided in a row identical with that of each of the second auxiliary electrodes AUE2 in the first direction DR1 and correspond to each of the second auxiliary electrodes AUE2.

The first electrode EL1 including the first main electrodes MAE1 and the first auxiliary electrodes AUE1, and the second electrode EL2 including the second main electrodes MAE2 and the second auxiliary electrodes AUE2 may function as alignment electrodes for aligning the light emitting elements LD in the emission area EMA of each of the pixels PXL.

Before the light emitting elements LD are aligned in the emission area EMA of each of the pixels PXL, a first alignment voltage may be applied to the first electrode EL1 through the first connection line CNL1, and a second alignment voltage may be applied to the second electrode EL2 through the second connection line CNL2. The first alignment voltage and the second alignment voltage may have different voltage levels. For example, the first alignment voltage may be a ground voltage, and the second alignment voltage may be an alternating current voltage.

As predetermined alignment voltages having different voltage levels are respectively applied to the first electrode EL1 and the second electrode EL2, an electric field may be formed between the first electrode EL1 and the second electrode EL2. Hence, the light emitting elements LD may be aligned between the first electrode EL1 and the second electrode EL2.

After the light emitting elements LD are aligned in the emission area EMA of each of the pixels PXL, each of the first electrodes EL1 and the second electrodes EL2 may function as a driving electrode for driving the light emitting elements LD.

Each of the first electrodes EL1 and the second electrodes EL2 may be made of material having a predetermined reflectivity to allow light emitted from the opposite ends EP1 and EP2 of each of the light emitting elements LD to travel in an image display direction (e.g., in a frontal direction) of the display device. In an embodiment, the first electrode ELL the second electrode EL2, the first connection line CNL1, and the second connection line CNL2 may be provided on the same layer and formed of the same material.

The first and second electrodes EL1 and EL2, the first and second connection lines CNL1 and CNL2 may be formed of conductive material having a predetermined reflectivity. The conductive material may include metal such as Ag, Mg, Al, Pt, Pd, Au, Ni, Nd, Ir, Cr, Ti, or an alloy of them, a transparent conductive oxide such as an indium tin oxide (ITO), an indium zinc oxide (IZO), a zinc oxide (ZnO), or an indium tin zinc oxide (ITZO), and a conductive polymer such as PEDOT. In an embodiment, in case that the first and second electrodes EL1 and EL2 and the first and second connection lines CNL1 and CNL2 include a transparent conductive oxide, a conductive polymer, or the like, a separate conductive layer made of opaque metal for reflecting light emitted from the light emitting elements LD in an image display direction of the display device may be additionally provided. The material of each of the first and second electrodes EL1 and EL2 and the first and second connection lines CNL1 and CNL2 is not limited to the foregoing materials.

Furthermore, although each of the first and second electrodes EL1 and EL2 and the first and second connection lines CNL1 and CNL2 is formed of a single layer, the disclosure is not limited thereto. In an embodiment, the first and second electrodes EL1 and EL2, and the first and second connection lines CNL1 and CNL2 may have a multilayer structure formed by stacking two or more materials among metals, alloys, conductive oxides, and conductive polymers. Each of the first and second electrodes EL1 and EL2 and the first and second connection lines CNL1 and CNL2 may be formed of multiple layers including at least two or more layers to minimize distortion resulting from a signal delay in case that signals (or voltages) are transmitted to opposite ends EP1 and EP2 of each of the light emitting elements LD. For example, each of the first and second electrodes EL1 and EL2 and the first and second connection lines CNL1 and CNL2 may be formed of a multilayer structure in which layers are stacked in a sequence of ITO/Ag/ITO.

As described above, since each of the first electrodes EL1 and the second electrodes EL2 have a shape corresponding to the shape of the bank pattern PW, light emitted from the opposite ends EP1 and EP2 of each of the light emitting elements LD may be reflected by the first and second electrodes EL1 and EL2 and more reliably travel in the image display direction of the display device. Consequently, the efficiency of light emitted from each of the light emitting elements LD may be further enhanced.

In an embodiment, the bank pattern PW and the first and second electrodes EL1 and EL2 each may function as a reflective component configured to guide light emitted from the light emitting elements LD in a desired direction and thus enhance the light efficiency of the display device. In other words, the bank pattern PW and the first and second electrodes EL1 and EL2 each may function as a reflective component configured to enable light emitted from the light emitting elements LD to travel in the image display direction of the display device, thereby enhancing the light output efficiency of the light emitting elements LD.

One electrode of the first electrode EL1 and the second electrode EL2 may be an anode electrode, and the other electrode may be a cathode electrode. In an embodiment, the first electrode EL1 may be an anode electrode, and the second electrode EL2 may be a cathode electrode.

Each of the light emitting elements LD may be formed of a light emitting diode which is made of material having an inorganic crystal structure and has a subminiature size, e.g., a size corresponding to the nanometer scale or the micrometer scale. The light emitting elements LD may be aligned between the first electrode EL1 and the second electrode EL2 in the pixel PXL.

At least two or several tens of light emitting elements LD may be aligned in the emission area EMA of each of the pixels PXL, but the disclosure is not limited thereto. In an embodiment, the number of light emitting elements LD provided in each of the pixels PXL may be changed in various ways.

Each of the light emitting elements LD may include a cylindrical light emitting element fabricated by an etching method, or a core-shell light emitting element fabricated by a growth method.

In case that each of the light emitting elements LD is a cylindrical light emitting element, each light emitting element LD may include an emission stack (or a stacked pattern) formed by successively stacking a first semiconductor layer 11, an active layer 12, a second semiconductor layer 13, and an electrode layer 15 in the longitudinal direction of each light emitting element LD. In case that each of the light emitting elements LD is a light emitting element having a core-shell structure, each light emitting element LD may include an emission pattern 10 having a first semiconductor layer 11 disposed in a central portion of the light emitting element LD, an active layer 12 which encloses at least one side of the first semiconductor layer 11, a second semiconductor layer 13 which encloses at least one side of the active layer 12, and an electrode layer 15 which encloses at least one side of the second semiconductor layer 13.

Each of the light emitting elements LD may include a first end EP1 and a second end EP2. One of the first semiconductor layer 11 and the second semiconductor layer 13 may be disposed in the first end EP1 of each of the light emitting elements LD, and the other one of the first semiconductor layer 11 and the second semiconductor layer 13 may be disposed in the second end EP2 thereof. Each of the light emitting elements LD may emit color light or white light.

The light emitting elements LD may be aligned between the first electrode EL1 and the second electrode EL2 by an electric field formed between the first electrode EL1 and the second electrode EL2 in the emission area EMA of each of the pixels PXL.

In detail, light emitting elements LD may be input into the emission area EMA of each of the pixels PXL by spraying and/or applying a fluidic solvent mixed with the light emitting elements LD in an inkjet printing method or the like after the electric field has been formed between the first electrode EL1 and the second electrode EL2. In an embodiment the solvent may be any one or more of acetone, water, alcohol, and toluene, but the disclosure is not limited thereto. For example, the solvent may include material which may be vaporized at the room temperature or by heat. Furthermore, the solvent may have the form of ink or paste. A method of spraying and/or applying the light emitting elements LD is not limited to that of the foregoing embodiment. The method of spraying and/or applying the light emitting elements LD may be changed in various ways. After the light emitting elements LD have been input into the emission area EMA of each of the pixels PXL, the solvent may be removed.

In case that the light emitting elements LD are input into the emission area EMA of each of the pixels PXL, self-alignment of the light emitting elements LD may be induced by the electric field formed between the first electrode EL1 and the second electrode EL2. Hence, the light emitting elements LD may be aligned between the first electrode EL1 and the second electrode EL2. In other words, the light emitting elements LD may be aligned in various directions in a target area, e.g., the emission area EMA of each of the pixels PXL.

In an embodiment, the first electrode EL1 may include the first main electrodes MAE1 and the first auxiliary electrodes AUE1, and the second electrode EL2 may include the second main electrodes MAE2 and the second auxiliary electrodes AUE2. Hence, the light emitting elements LD may be aligned between the first main electrodes MAE1 and the second auxiliary electrodes AUE2 and between the second main electrodes MAE2 and the first auxiliary electrodes AUE1. Furthermore, in an embodiment, in a plan view, some light emitting elements LD may be aligned between a first main electrode MAE1 and a second main electrode MAE2 that face each other in a diagonal direction.

The light emitting elements LD may be aligned between the first electrode EL1 and the second electrode EL2 in the emission area EMA of each of the pixels PXL. Particularly, one of the opposite ends EP1 and EP2 of the light emitting elements LD may be electrically connected to the first electrode EL1, and the other of the opposite ends EP1 and EP2 of the light emitting elements LD may be electrically connected to the second electrode EL2. Hence, a signal (or a voltage) of the first transistor T1 of the pixel circuit layer PCL of each of the pixels PXL may be applied to one end of the opposite ends EP1 and EP2 of the light emitting elements LD via the first electrode EL1. The voltage of the second driving power supply VSS of the driving voltage line DVL may be applied to the other end via the second electrode EL2.

The light emitting elements LD may form a valid light source of each of the pixels PXL. For example, if driving current flows through each of the pixels PXL during each frame period, the light emitting elements LD electrically connected to the first and second electrodes EL1 and EL2 of each pixel PXL may emit light having a luminance corresponding to the driving current.

The above-mentioned light emitting elements LD may be aligned on the first insulating layer INS1 in the emission area EMA of each of the pixels PXL.

The first insulating layer INS1 may be formed and/or provided under each of the light emitting elements LD between the first electrode EL1 and the second electrode EL2 in the emission area EMA of each of the pixels PXL. The first insulating layer INS1 may be fill a space between the passivation layer PSV and each of the light emitting elements LD to stably support the light emitting elements LD and prevent the light emitting elements LD from being removed from the passivation layer PSV.

In the emission area EMA of each of the pixels PXL, the first insulating layer INS1 may expose a predetermined area of the first electrode EL1 and cover (or overlap) a remaining area other than the exposed predetermined area to protect the remaining area of each of the first electrode EL1. Furthermore, the first insulating layer INS1 may expose a predetermined area of the second electrode EL2, and cover a remaining area other than the exposed predetermined area to protect the remaining area of each of the second electrode EL2. The first insulating layer INS1 may be formed and/or provided on the passivation layer PSV in the peripheral area of each of the pixels PXL to protect components disposed in the peripheral area.

The first insulating layer INS1 may be formed of an inorganic insulating layer including inorganic material, or an organic insulating layer including organic material. Although in an embodiment the first insulating layer INS1 may be formed of inorganic insulating layer having an advantage in protecting the light emitting elements LD from the pixel circuit layer PCL, the disclosure is not limited thereto. In an embodiment, the first insulating layer INS1 may be formed of an organic insulating layer that has an advantage in planarization of support surfaces of the light emitting elements LD.

A second insulating layer INS2 may be provided and/or formed on the light emitting elements LD. The second insulating layer INS2 may be provided and/or formed on each of the light emitting elements LD to cover (or overlap) a portion of an upper surface of each light emitting element LD, and may expose the opposite ends EP1 and EP2 of each light emitting elements LD to the outside. The second insulating layer INS2 may be formed in an independent pattern in the emission area EMA of each of the pixels PXL, but the disclosure is not limited thereto. In an embodiment, the second insulating layer INS2 may be omitted. In this case, the first contact electrode CNE1 may directly contact one of the opposite ends EP1 and EP2 of each of the light emitting elements LD. The second contact electrode CNE2 may directly contact the other of the opposite ends EP1 and EP2 of each of the light emitting elements LD. Here, the first contact electrode CNE1 and the second contact electrode CNE2 may be electrically disconnected from each other.

The second insulating layer INS2 may be formed of a single layer or multiple layers, and include an inorganic insulating layer including at least one inorganic material or an organic insulating layer including at least one organic material. The second insulating layer INS2 may fix each of the light emitting elements LD aligned in the emission area EMA of each of the pixels PXL. In an embodiment, the second insulating layer INS2 may include an inorganic insulating layer that has an advantage in protecting the active layer 12 of each of the light emitting elements LD from external oxygen, water, etc. However, the disclosure is not limited thereto. The second insulating layer INS2 may be formed of an organic insulating layer including organic material, depending on design conditions of the display device to which the light emitting elements LD are applied.

In an embodiment, after the alignment of the light emitting elements LD in the emission area EMA of each of the pixels PXL have been completed, the second insulating layer INS2 is formed on the light emitting elements LD so that the light emitting elements LD may be prevented from being removed from the aligned position. If a space is present between the first insulating layer INS1 and the light emitting elements LD before the second insulating layer INS2 is formed, the space may be filled with the second insulating layer INS2 during a process of forming the second insulating layer INS2. Consequently, the light emitting elements LD may be stably supported. Hence, the second insulating layer INS2 may be formed of an organic insulating layer that has an advantage in filling the space between the first insulating layer INS1 and the light emitting elements LD with the second insulating layer INS2.

In an embodiment, the second insulating layer INS2 may be formed on each of the light emitting elements LD so that the active layer 12 of each light emitting element LD may be prevented from contacting external conductive material. The second insulating layer INS2 may cover (or overlap) only a portion of the upper surface of each of the light emitting elements LD such that the ends EP1 and EP2 of each light emitting element LD may be exposed to the outside.

The first contact electrode CNE1 may be provided on the first electrode EL1 of each of the pixels PXL to electrically and/or physically reliably connect the first electrode EL1 with one of the opposite ends EP1 and EP2 of each of the light emitting elements LD. The second contact electrode CNE2 may be provided on the second electrode EL2 of each of the pixels PXL to electrically and/or physically reliably connect the second electrode EL2 with the other of the opposite ends EP1 and EP2 of each of the light emitting elements LD.

In an embodiment, each of the first and second contact electrodes CNE1 and CNE2 may be formed of various transparent conductive materials. For example, each of the first and second contact electrodes CNE1 and CNE2 may be formed of transparent conductive material for minimizing loss of light that is emitted from each of the light emitting elements LD and reflected in the frontal direction of the display device by the corresponding electrode. The transparent conductive material may include at least one of various conductive materials, e.g., ITO, IZO, and ITZO, and may be substantially transparent or semi-transparent to satisfy a predetermined transmittance. The material of the first and second contact electrodes CNE1 and CNE2 is not limited to the above-mentioned materials.

Each of the first and second contact electrodes CNE1 and CNE2 may have a bar shape extending in the second direction DR2. The first contact electrode CNE1 may partially overlap one of the opposite ends EP1 and EP2 of each of the light emitting elements LD. The second contact electrode CNE2 may partially overlap the other of the opposite ends EP1 and EP2 of each of the light emitting elements LD.

In an embodiment, the first and second contact electrodes CNE1 and CNE2 may be provided on respective different layers. In this case, the first contact electrode CNE1 may be provided and/or formed on the second insulating layer INS2 and covered (or overlapped) with a third insulating layer INS3. Furthermore, the second contact electrode CNE2 may be provided and/or formed on the third insulating layer INS3 and covered with a fourth insulating layer INS4. The third and fourth insulating layers INS3 and INS4 may be formed of any one of an inorganic insulating layer including inorganic material or an organic insulating layer including organic material. An overcoat layer OC may be provided and/or formed on the fourth insulating layer INS4.

Although in the foregoing embodiment there has been described that the first and second contact electrodes CNE1 and CNE2 are provided and/or formed on respective different layers, the disclosure is not limited thereto. In an embodiment, the first and second contact electrodes CNE1 and CNE2 may be provided and/or formed on an identical layer, as illustrated in FIG. 7. In this case, the first contact electrode CNE1 and the second contact electrode CNE2 may be spaced apart from each other by a predetermined distance on the second insulating layer INS2 and thus electrically disconnected from each other, and may be covered (or overlapped) with the third insulating layer INS3. The overcoat layer OC may be provided and/or formed on the third insulating layer INS3. Here, the third insulating layer INS3 may correspond to the fourth insulating layer INS4 in case that the first and second contact electrodes CNE1 and CNE2 are provided and/or formed on respective different layers.

The overcoat layer OC may be an encapsulation layer, configured to mitigate a step difference (or height difference) formed by the bank pattern PW, the first and second contact electrodes CNE1 and CNE2, and the first and second electrodes EL1 and EL2 that are disposed under the overcoat layer OC, and prevent oxygen or water from permeating the light emitting elements LD. In an embodiment, the overcoat layer OC may be omitted taking into design conditions, etc. of the display device.

As described above, predetermined voltages are applied to the opposite ends EP1 and EP2 of each of the light emitting elements LD through the first electrode EL1 and the second electrode EL2 so that each of the light emitting elements LD may emit light by coupling of electron-hole pairs in the active layer 12 of each light emitting element LD. Each of the light emitting elements LD may emit light having a wavelength band, e.g., ranging from about 400 nm to about 900 nm.

In an embodiment, in the emission area EMA of each of the pixels PXL, the capping layer CPL may be provided and/or formed, as illustrated in FIG. 8.

The capping layer CPL may be respectively disposed between the first electrode EL1 and the first contact electrode CNE1 and between the second electrode EL2 and the second contact electrode CNE2. Furthermore, the capping layer CPL may be provided and/or formed on each of the first and second connection lines CNL1 and CNL2.

The capping layer CPL may prevent the corresponding electrode from being damaged due to a failure caused during a process of fabricating the display device, and reinforce adhesive force between the corresponding electrode and the passivation layer PSV. The capping layer CPL may be formed of transparent conductive material such as indium zinc oxide (IZO) to minimize loss of light emitted from each of the light emitting elements LD and reflected by the corresponding electrode in the image display direction of the display device.

As described above, the first electrode EL1 may include first main electrodes MAE1 and first auxiliary electrodes AUE1 which have different shapes and different widths, so that the width of the first electrode EL1 in the first direction DR1 may not be constant in the direction in which the first electrode EL1 extends. In other words, the first electrode EL1 may have at least two widths W1 and W2 in the extension direction thereof.

Likewise, since the second electrode EL2 includes the second main electrodes MAE2 and the second auxiliary electrodes AUE2 that have different shapes and different widths, the width of the second electrode EL2 in the first direction DR1 may not be constant in a direction in which the second electrode EL2 extends. In other words, the second electrode EL2 may have at least two widths W3 and W4 in the extension direction thereof.

If the first electrode EL1 and the second electrode EL2 are supplied with corresponding alignment voltages before the light emitting elements LD are aligned in the emission area EMA of each of the pixels PXL, an electric field may be formed between the first electrode EL1 and the second electrode EL2. As described above, since the width of each of the first and second electrodes EL1 and EL2 in the first direction DR1 is not constant in the extension direction thereof (or have at least two widths in the extension direction thereof), the magnitude of the electric field and the direction of the electric field may vary by areas between the first electrode EL1 and the second electrode EL2.

Hence, some of the light emitting elements LD may be aligned such that the longitudinal direction (L) thereof is parallel to the first direction DR1, other some of the light emitting elements LD may be aligned such that the longitudinal direction (L) thereof is parallel to a direction inclined at a predetermined angle with respect to the first direction DR1, and other some of the light emitting elements LD may be aligned such that the longitudinal direction (L) thereof is parallel to a direction opposite to the inclined direction. Consequently, the light emitting elements LD may be aligned around each of the first main electrodes MAE1 of the first electrode EL1 and/or the second main electrodes MAE2 of the second electrode EL2 in four directions. Furthermore, the light emitting elements LD may be aligned around each of the first auxiliary electrodes AUE1 of the first electrode EL1 and/or the second auxiliary electrodes AUE2 of the second electrode EL2 in four directions thereof.

Since the respective widths of the first and second electrodes EL1 and EL2 in the first direction DR1 are not constant in the respective extension directions of the first and second electrodes EL1 and EL2, the light emitting elements LD may be prevented from being aligned biasedly in a specific direction, e.g., in the first direction DR1, in the emission area EMA of each of the pixels PXL. Therefore, light emitted from each of the light emitting elements LD may be prevented from being concentrated in a specific direction. Hence, the display device in accordance with an embodiment may have uniform light output distribution in the overall area thereof.

If in the same manner as the conventional display device the width of each of the first electrode EL1 and the second electrode EL2 in the first direction DR1 is constant in the extension direction of each of the first and second electrodes EL1 and EL2, a distance between the first electrode EL1 and the second electrode EL2 may be constant regardless of areas. In this case, the electric field formed between the first electrode EL1 and the second electrode EL2 has a constant magnitude and constant orientation, the light emitting elements LD may be aligned in an identical direction, e.g., the first direction DR1, in the emission area EMA of each of the pixels PXL, and light emitted from each of the light emitting elements LD may travel in the first direction DR1. Therefore, in the alignment direction of the light emitting elements LD, light emitted from each of the light emitting elements LD may be concentrated. In case that light is concentrated in a specific direction in the emission area EMA of each of the pixels PXL, light output distributions of the light by areas of the display device may differ from each other, whereby image quality failure may be caused.

Therefore, in the display device in accordance with an embodiment, the light emitting elements LD may be aligned in various directions in the emission area EMA of each of the pixels PXL by changing the shapes of the first electrode EL1 and the second electrode EL2 so that light emitted from each of the light emitting elements LD can be prevented from being concentrated in a specific direction.

FIGS. 12 to 19 illustrate embodiments of the pixel of FIG. 4, and are plan views schematically illustrating a pixel including only some components of the display element layer.

Although FIGS. 12 to 19 schematically illustrate the structure of each of pixel, e.g., illustrating only the first and second electrodes, the first and second connection lines, and the light emitting elements that are included in the display element layer of each of the pixels PXL, the disclosure is not limited thereto.

In addition, in FIGS. 12 to 19, for the sake of explanation, illustration of the pixel circuit layer (at least one transistor and signal lines electrically connected to the transistor) electrically connected to the light emitting elements is omitted from FIGS. 12 to 19.

The following description of embodiments of FIGS. 12 to 19 will be focused on differences from that of the foregoing embodiments, to avoid repetitive descriptions thereof. Components which are not separately explained in the following description of the embodiments of FIGS. 12 to 19 comply with those of the foregoing embodiments. The same reference numeral will be used to designate the same component, and a similar reference numeral will be used to designate a similar component.

Referring to FIGS. 1A to 1F, 2, and 12 to 19, each of the pixels PXL in accordance with an embodiment may include a substrate SUB, a pixel circuit layer PCL (see FIG. 6), and a display element layer DPL (see FIG. 6).

The display element layer of each of the pixels PXL may include first and second electrodes EL1 and EL2, light emitting elements LD, and first and second connection lines CNL1 and CNL2. Although not illustrated in FIGS. 12 to 19, the display element layer DPL of each of the pixels PXL may further include a bank pattern PW (see 4) provided and/or formed under each of the first and second electrodes EL1 and EL2, and first and second contact electrodes CNE1 and CNE2 (see FIG. 4) which are respectively provided and/or formed on the first and second electrodes EL1 and EL2.

Each of the first and second electrodes EL1 and EL2 may be provided in the emission area EMA of each of the pixels PXL and extend in the second direction DR2 (e.g., a "column direction"). The first and second electrodes EL1 and EL2 may be provided on a same plane and spaced apart from each other by a predetermined distance.

In an embodiment, the first electrode EL1 may include first main electrodes MAE1 and first auxiliary electrodes AUE1.

Each of the first main electrodes MAE1 may be spaced apart from an adjacent first main electrode MAE1 in the second direction DR2. Although each of the first main electrodes MAE1 may have a rectangular shape in a plan view, the shape of each of the first main electrodes MAE1 is not limited to the foregoing embodiment. In an embodiment, each of the first main electrodes MAE1 may have a circular shape, a rhombic shape, or an elliptical shape. In other words, the first main electrodes MAE1 may have various shapes.

Figure 19:
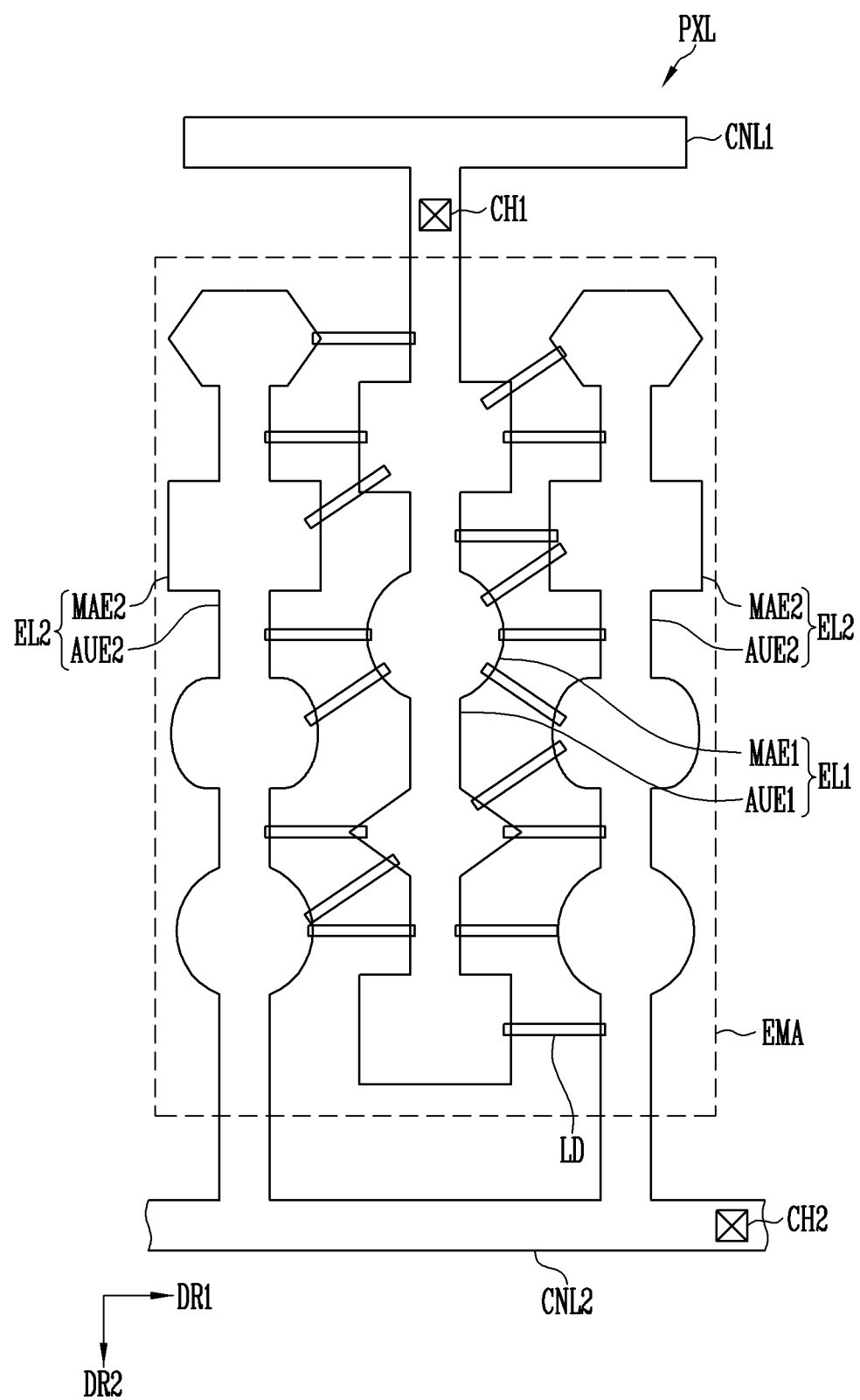

Furthermore, some first main electrodes MAE1, and/or other some first main electrodes MAE1 may have different shapes. For example, as illustrated in FIG. 19, a first main electrode MAE1 that is disposed at a first position in the second direction DR2 may have a rectangular shape. A first main electrode MAE1 that is adjacent to the rectangular first main electrode MAE1 in the second direction DR2 may have a circular shape. A first main electrode MAE1 that is adjacent to the circular first main electrode MAE1 in the second direction DR2 may have a rhombic shape. A first main electrode MAE1 that is adjacent to the rhombic first main electrode MAE1 in the second direction DR2 may have a rectangular shape. The first main electrodes MAE1 that have different shapes in the second direction DR2 may have different widths in the first direction DR1.

As described above, the first main electrodes MAE1 that have different shapes in the second direction DR2 may be provided and/or formed on an identical layer and fabricated by an identical process.

Each of the first auxiliary electrodes AUE1 may function as a bridge for electrically coupling two first main electrodes MAE1 disposed adjacent to each other in the second direction DR2 and have a rectangular shape, but the disclosure is not limited thereto, and it may have various shapes including a circular shape, an elliptical shape, and a rhombic shape.

In an embodiment, the first main electrodes MAE1 and the first auxiliary electrodes AUE1 may be provided integrally with each other and be electrically and/or physically connected to each other. Furthermore, since the first main electrodes MAE1 and the first auxiliary electrodes AUE1 have different shapes, the surface area (or the size) of each of the first main electrodes MAE1 and the surface area (or the size) of each of the first auxiliary electrodes AUE1 may differ from each other.

In an embodiment, the width W1 of each of the first main electrodes MAE1 in the first direction DR1 may be greater than the width W2 of each of the first auxiliary electrodes AUE1 in the first direction DR1, so that the surface area (or the size) of each of the first main electrodes MAE1 may be greater than the surface area (or the size) of each of the first auxiliary electrodes AUE1. However, the disclosure is not limited thereto, and the reverse case is also possible. In other words, the width W2 of each of the first auxiliary electrodes AUE1 in the first direction DR1 may be greater than the width W1 of each of the first main electrodes MAE1 in the first direction DR1, so that the surface area (or the size) of each of the first auxiliary electrodes AUE1 may be greater than the surface area (or the size) of each of the first main electrodes MAE1.

Figure 17:
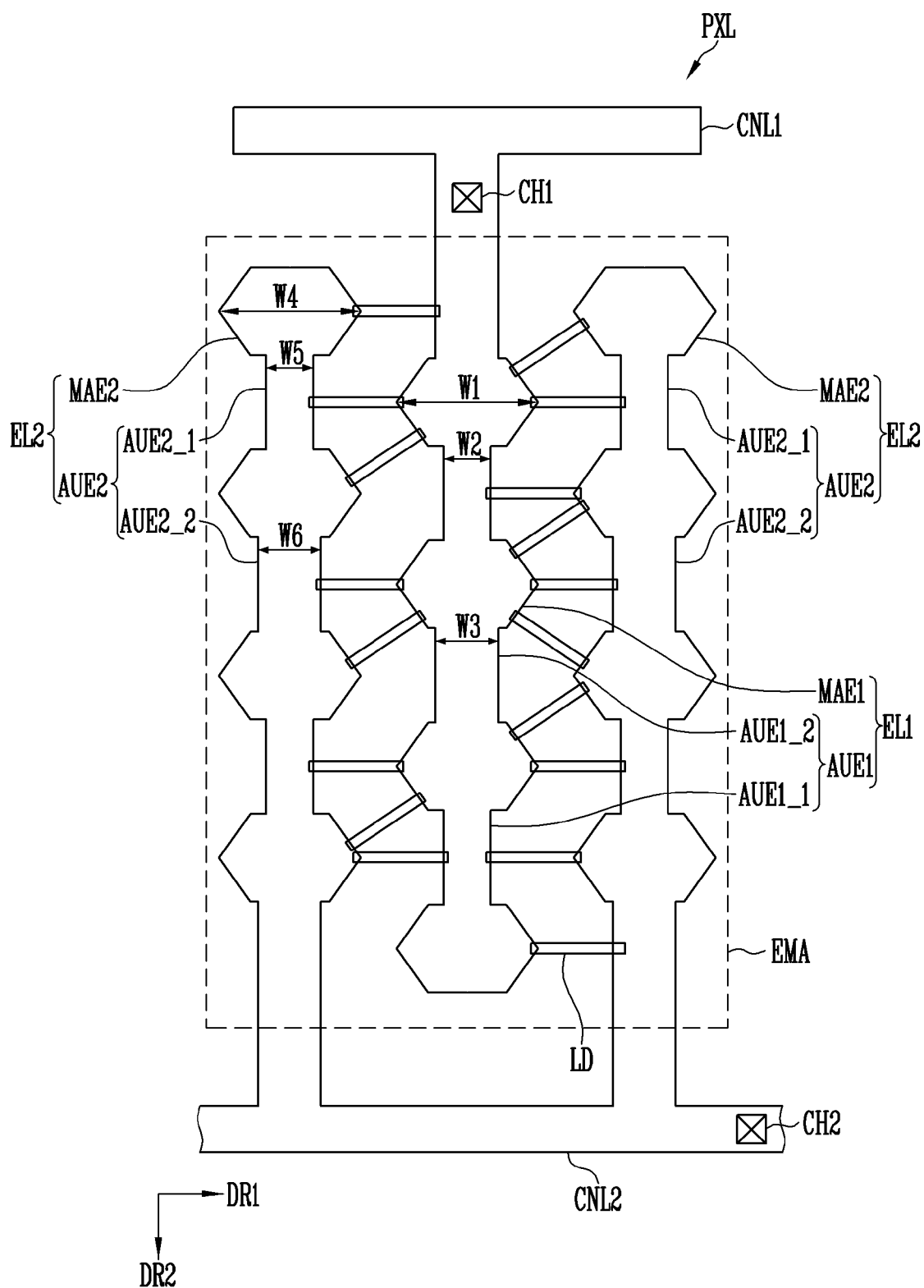

Furthermore, as illustrated in FIG. 17, the first auxiliary electrodes AUE1 may include a 1-1-th auxiliary electrode AUE1_1 and a 1-2-th auxiliary electrode AUE1_2 which have different widths in the first direction DR1. The width W2 of the 1-1-th auxiliary electrode AUE1_1 in the first direction DR1 may be less than the width W3 of the 1-2-th auxiliary electrode AUE1_2 in the first direction DR1, but the disclosure is not limited thereto, and the reverse case thereof is also possible. In other words, width W2 of the 1-1-th auxiliary electrode AUE1_1 in the first direction DR1 may be greater than the width W3 of the 1-2-th auxiliary electrode AUE1_2 in the first direction DR1.

As described above, the first main electrodes MAE1 and the first auxiliary electrodes AUE1 that are integrally formed and/or provided and electrically and/or physically connected and have different shapes and/or surface areas (or sizes) may form the first electrode EL1 of each of the pixels PXL. Because of the first main electrodes MAE1 and the first auxiliary electrodes AUE1, the width of the first electrode EL1 may not be constant in a direction in which the first electrode EL1 extends. In other words, the first electrode EL1 may have at least two widths W1 and W2 in the extension direction thereof, e.g., in the second direction DR2.

In an embodiment, the shape of each of the first main electrodes MAE1 and the first auxiliary electrodes AUE1 may be changed in various ways within a range in which it has at least two widths (or a variable width) in the direction in which the first electrode EL1 extends.

In an embodiment, the second electrode EL2 may include second main electrodes MAE2 and second auxiliary electrodes AUE2.

Each of the second main electrodes MAE2 may be spaced apart from an adjacent second main electrode MAE2 in the second direction DR2. Although each of the second main electrodes MAE2 may have a rectangular shape in a plan view, the shape of each of the second main electrodes MAE2 is not limited to that of the foregoing embodiment. In an embodiment, each of the second main electrodes MAE2 may have a circular shape, rhombic shape, or an elliptical shape. In other words, the second main electrodes MAE2 may have various shapes.

Furthermore, other some second main electrodes MAE2, and/or other some second main electrodes MAE2 may have different shapes. For example, as illustrated in FIG. 19, a second main electrode MAE2 that is disposed at a first position in the second direction DR2 may have a hexagonal shape. A second main electrode MAE2 that is adjacent to the hexagonal second main electrode MAE2 in the second direction DR2 may have a rectangular shape. A second main electrode MAE2 that is adjacent to the rectangular second main electrode MAE2 in the second direction DR2 may have an elliptical shape. A second main electrode MAE2 that is adjacent to the elliptical second main electrode MAE2 in the second direction DR2 may have a circular shape. The second main electrodes MAE2 that have different shapes in the second direction DR2 may have different widths in the first direction DR1.

As described above, the second main electrodes MAE2 that have different shapes in the second direction DR2 may be provided and/or formed on an identical layer and fabricated by an identical process.

Figure 16:
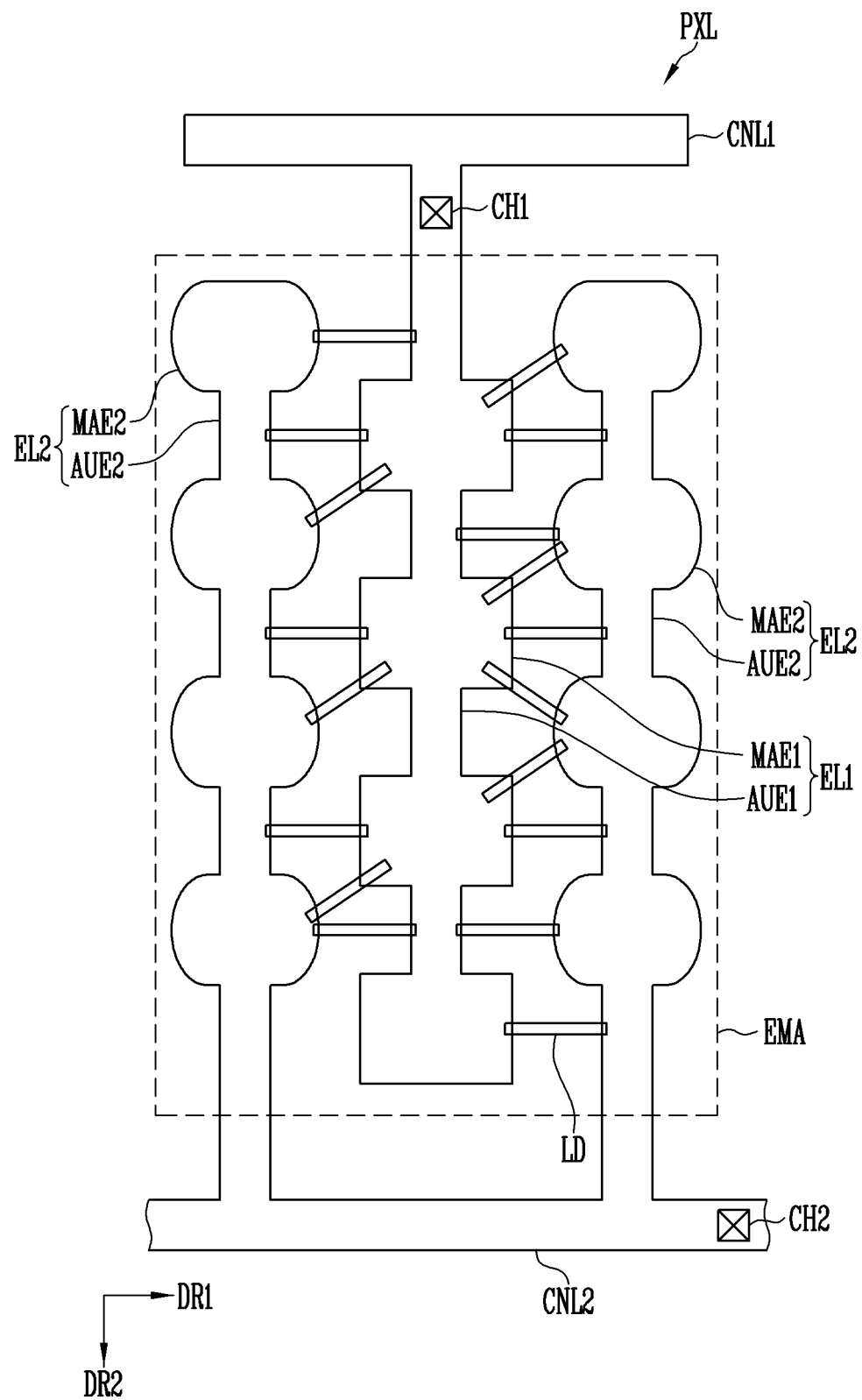

In an embodiment, each of the second main electrodes MAE2 and each of the first main electrodes MAE1 may have a same shape, but the disclosure is not limited thereto. In an embodiment, each of the second main electrodes MAE2 and each of the first main electrodes MAE1 may have different shapes. For example, as shown in FIG. 16, in case that the first main electrodes MAE1 have a rectangular shape, the second main electrodes MAE2 may have an elliptical shape, and vice versa. In this case, the width W1 of each of the first main electrodes MAE1 in the first direction DR1 may be identical with or different from the width W3 of each of the second main electrodes MAE2 in the first direction DR1.

Figure 18:
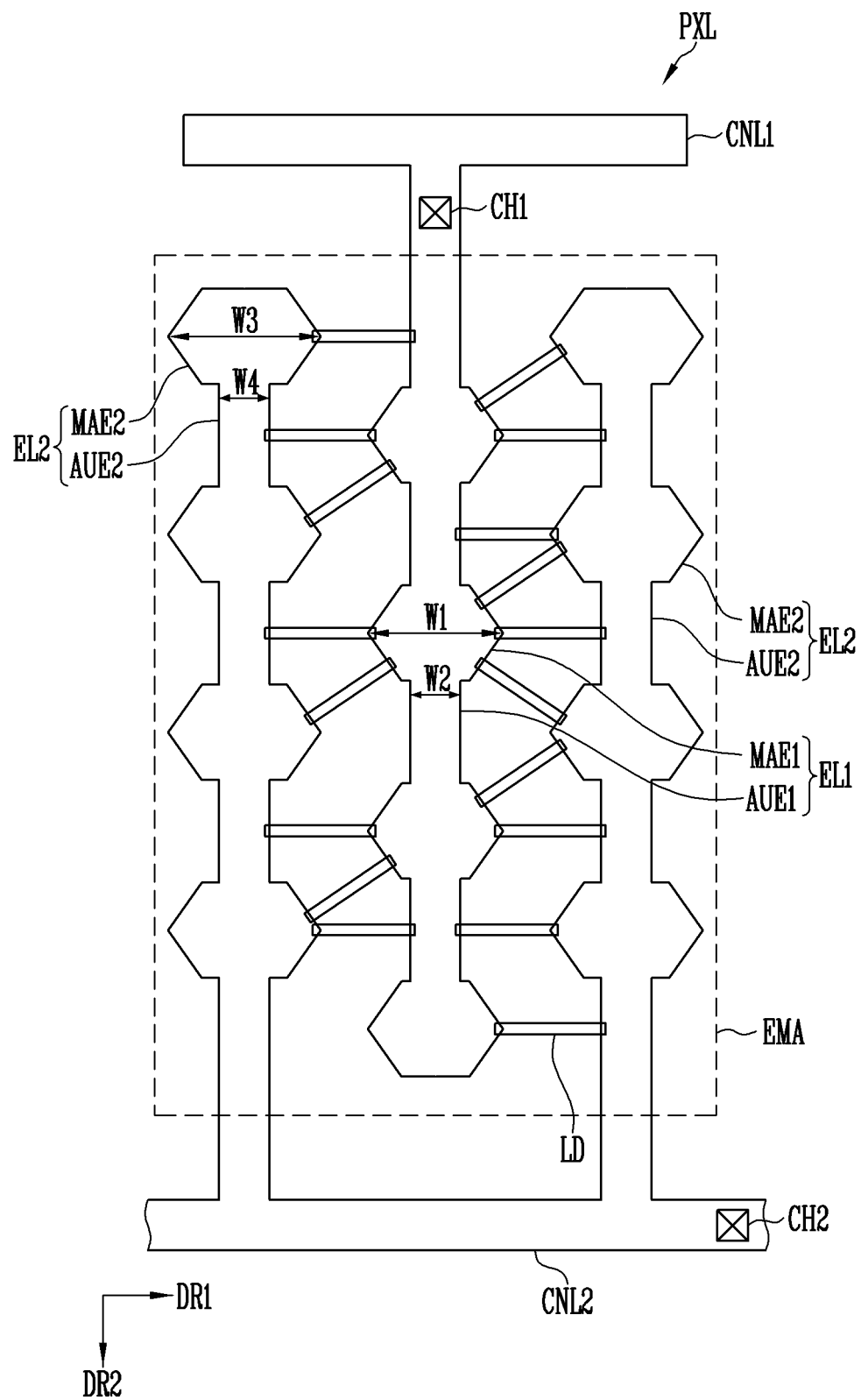

In case that each of the second main electrodes MAE2 and each of the first main electrodes MAE1 has a same shape, the second main electrodes MAE2 and the first main electrodes MAE1 may have an identical surface area (or size) or may have different surface areas (or sizes). In case that each of the second main electrodes MAE2 and each of the first main electrodes MAE1 have different surface areas (or sizes), each of the second main electrodes MAE2 may have a surface area (or size) greater than that of each of the first main electrodes MAE1, as shown in FIG. 18. However, the disclosure is not limited thereto, and the reverse case is also possible. In other words, each of the second main electrodes MAE2 may have a surface area (or size) less than that of each of the first main electrodes MAE1.

Each of the second auxiliary electrodes AUE2 may function as a bridge for electrically connecting two second main electrodes MAE2 disposed adjacent to each other in the second direction DR2, and the second auxiliary electrode AUE2 and the first auxiliary electrodes AUE1 may have a same shape or different shapes, depending on embodiments.

In an embodiment, the second main electrodes MAE2 and the second auxiliary electrodes AUE2 may be provided integrally with each other, and be electrically and/or physically connected to each other. Furthermore, since the second main electrodes MAE2 and the second auxiliary electrodes AUE2 have different shapes, the surface area (or the size) of each of the second main electrodes MAE2 and the surface area (or the size) of each of the second auxiliary electrodes AUE2 may differ from each other.

In an embodiment, the width W3 of each of the second main electrodes MAE2 in the first direction DR1 may be greater than the width W4 of each of the second auxiliary electrodes AUE2 in the first direction DR1, so that the surface area (or the size) of each of the second main electrodes MAE2 may be greater than the surface area (or the size) of each of the second auxiliary electrodes AUE2. However, the disclosure is not limited thereto, and the reverse case is also possible. In other words, the width W4 of each of the second auxiliary electrodes AUE2 in the first direction DR1 may be greater than the width W3 of each of the second main electrodes MAE2 in the first direction DR1, so that the surface area (or the size) of each of the second auxiliary electrodes AUE2 may be greater than the surface area (or the size) of each of the second main electrodes MAE2.

Furthermore, as illustrated in FIG. 17, the second auxiliary electrodes AUE2 may include a 2-1-th auxiliary electrode AUE2_1 and a 2-2-th auxiliary electrode AUE2_2 which have different widths in the first direction DR1. A width W5 of the 2-1-th auxiliary electrode AUE2_1 in the first direction DR1 may be less than a width W6 of the 2-2-th auxiliary electrode AUE2_2 in the first direction DR1, but the disclosure is not limited thereto, and the reverse case thereof is also possible. In other words, width W5 of the 2-1-th auxiliary electrode AUE2_1 in the first direction DR1 may be greater than the width W6 of the 2-2-th auxiliary electrode AUE2_2 in the first direction DR1.

In an embodiment, each of the second main electrodes MAE2 of the second electrode EL2 may alternate with each of the first auxiliary electrodes AUE1 of the first electrode EL1 in the first direction DR1. Each of the second auxiliary electrodes AUE2 of the second electrode EL2 may alternate with each of the first main electrodes MAE1 of the first electrode EL1 in the first direction DR1. In other words, each of the second main electrodes MAE2 may be disposed in a row identical with that of the first auxiliary electrodes AUE1 and correspond to the first auxiliary electrodes AUE1. Each of the second auxiliary electrodes AUE2 may be disposed in a row identical with that of the first main electrodes MAE1 and correspond to the first main electrodes MAE1. Here, the present disclosure is not limited thereto. Each of the second main electrodes MAE2 may be disposed in a row identical with that of the first main electrodes MAE1. Each of the second auxiliary electrodes AUE2 may be disposed in a row identical with that of the first auxiliary electrodes AUE1.

As described above, the second main electrodes MAE2 and the second auxiliary electrodes AUE2 that are integrally formed and/or provided and electrically and/or physically connected and have different shapes and/or surface areas (or sizes) may form the second electrode EL2 of each of the pixels PXL. Because of the plurality of second main electrodes MAE2 and the second auxiliary electrodes AUE2, the width of the second electrode EL2 in the first direction DR1 may not be constant in a direction in which the second electrode EL2 extends. In other words, the second electrode EL2 may have at least two widths W3 and W4 in the extension direction thereof, e.g., in the second direction DR2.

Since each of the first and second electrodes EL1 and EL2 has at least two widths in the second direction DR2 (or the width thereof in the first direction DR1 is not constant), the light emitting elements LD in the emission area EMA of each of the pixels PXL may be aligned in various directions rather than being aligned in a specific direction. Therefore, light emitted from each of the light emitting elements LD may travel in various directions rather than being concentrated in a specific direction. Consequently, the display device in accordance with an embodiment may have a uniform light output distribution in an overall area thereof, so that image quality failure resulting from different light output distributions by areas may be minimized.

Figure 20:
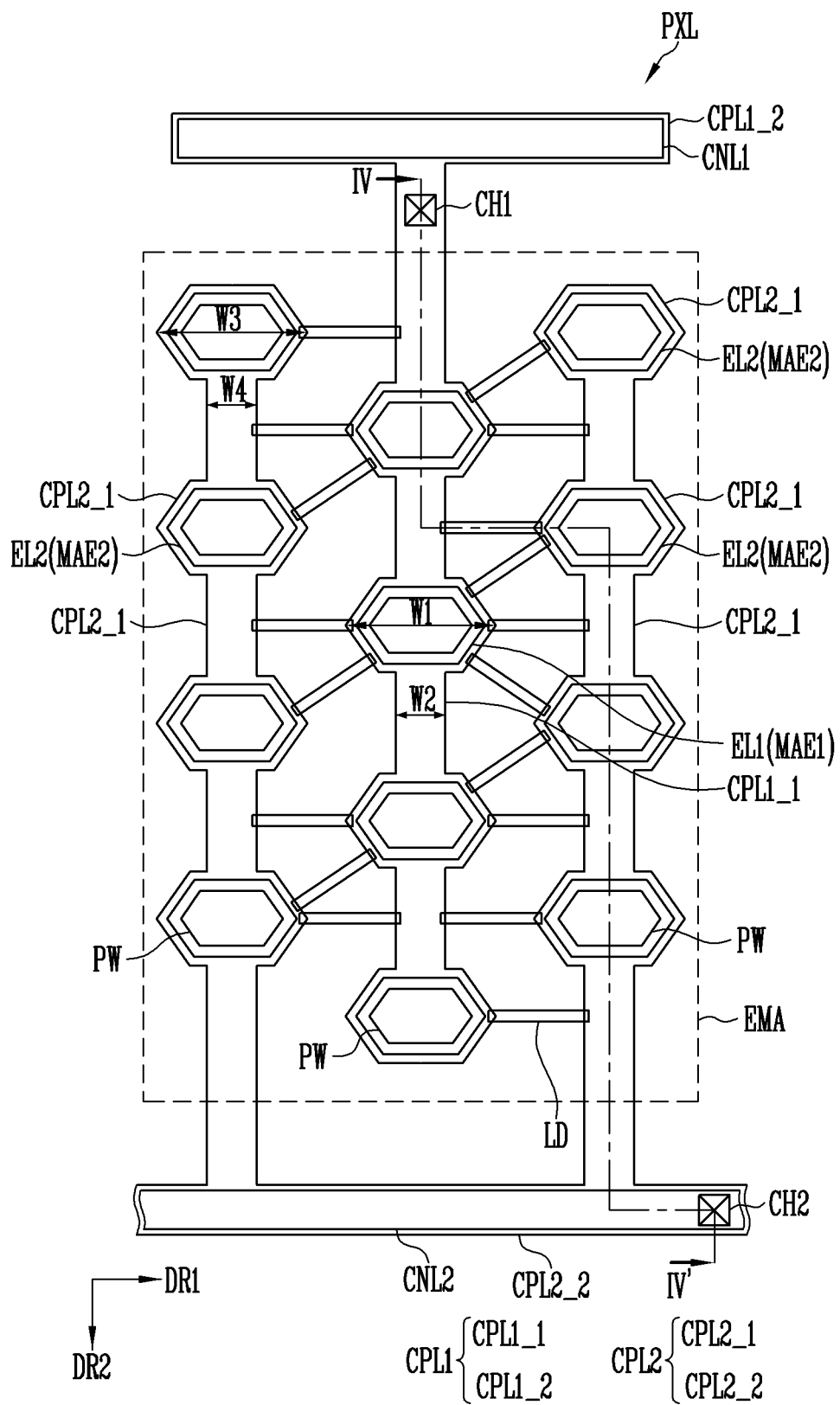
FIG. 20 illustrates another embodiment of the pixel of FIG. 4, and is a plan view schematically illustrating a pixel including only some components of the display element layer.
Figure 21:
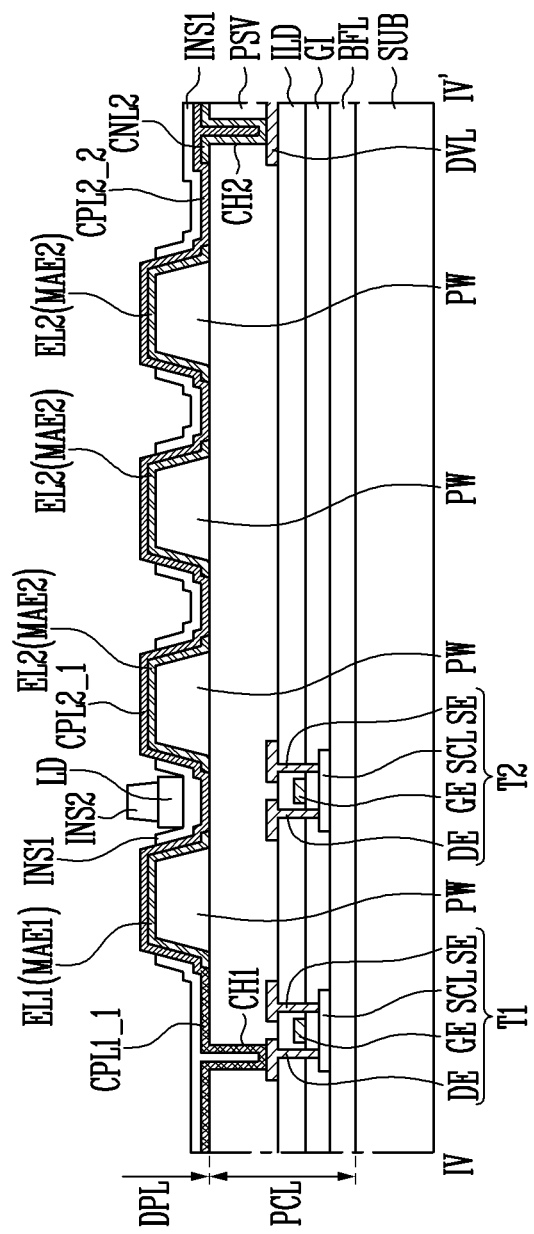
FIG. 21 is a schematic cross-sectional view taken along line IV-IV' of FIG. 20.

FIG. 20 illustrates an embodiment of the pixel of FIG. 4, and is a plan view schematically illustrating a pixel including only some components of the display element layer. FIG. 21 is a schematic sectional view taken along line IV-IV' of FIG. 20.

Although FIGS. 20 and 21 schematically illustrate the structure of each of pixel, e.g., including the first and second electrodes, the first and second connection lines, and the light emitting elements that are included in the display element layer of each of the pixels, the disclosure is not limited thereto.

In FIGS. 20 and 21, for the sake of explanation, illustration of the pixel circuit layer (at least one transistor and signal lines electrically connected to the transistor) electrically connected to the light emitting elements is omitted form FIGS. 20 and 21.

Furthermore, FIGS. 20 and 21 more schematically illustrate the structure of a pixel PXL, e.g., in which each electrode is a single electrode layer, and each insulating layer is a single insulating layer.

The following description of embodiments of FIGS. 20 and 21 will be focused on differences from that of the foregoing embodiments, to avoid repetitive descriptions thereof. Components which are not separately described in the following description of the embodiments of FIGS. 20 and 21 comply with those of the foregoing embodiments. The same reference numeral will be used to designate the same component, and a similar reference numeral will be used to designate a similar component.

Referring to FIGS. 1A to 1F, 2, 20, and 21, each of the pixels PXL in accordance with an embodiment may include a substrate SUB, a pixel circuit layer PCL, and a display element layer DPL.

The pixel circuit layer PCL may include first and second transistors T1 and T2, a driving voltage line DVL, and a passivation layer PSV configured to cover or overlap) the first and second transistors T1 and T2 and the driving voltage line DVL.

The display element layer DPL may include a bank pattern PW, first main electrodes MAE1, second main electrodes MAE2, first and second capping layers CPL1 and CPL2, light emitting elements LD, and first and second connection lines CNL1 and CNL2. Although not shown in the drawings, the display element layer DPL may include a contact electrode configured to connect one of the opposite ends EP1 and EP2 of the light emitting elements LD to each of the first main electrodes MAE1, and a contact electrode configured to connect the other of the opposite ends EP1 and EP2 of the light emitting elements LD to each of the second main electrodes MAE2.

Each of the first and second connection lines CNL1 and CNL2 may extend in the first direction DR1 (e.g., the "row direction") of each of the pixels PXL. The second connection line CNL2 may be electrically connected to the driving voltage line DVL through the second contact hole CH2 that passes through the passivation layer PSV, so that the voltage of the second driving power supply VSS (see FIG. 3A) may be applied to the second connection line CNL2.

In an embodiment, each of the first main electrodes MAE1 may be disposed in the second direction DR2 (e.g., the "column direction") and spaced, by a distance, from the first main electrodes MAE1 adjacent thereto in the second direction DR2. Hence, each of the first main electrodes MAE1 may be electrically and/or physically separated from the first main electrodes MAE1 adjacent thereto in the second direction DR2. In an embodiment, each of the first main electrodes MAE1 may be a first electrode ELL Here, for the sake of explanation, each of the first main electrodes MAE1 will be referred to as a first electrode EL1.

Likewise, each of the second main electrodes MAE2 may be disposed in the second direction DR2 and spaced, by a predetermined distance, apart from the second main electrodes MAE2 adjacent thereto in the second direction DR2. Hence, each of the second main electrodes MAE2 may be electrically and/or physically separated from the second main electrodes MAE2 adjacent thereto in the second direction DR2. In an embodiment, each of the second main electrodes MAE2 may be a second electrode EL2. Here, for the sake of explanation, each of the second main electrodes MAE2 will be referred to as a second electrode EL2.

In an embodiment, the first capping layer CPL1 may include a 1-1-th capping layer CPL1_1 extending in the second direction DR2, and a 1-2-th capping layer CPL1_2 extending in the first direction DR1. The first capping layer CPL1 may be formed of transparent conductive material to minimize loss of light that is emitted by each of the light emitting elements LD and travels in an image display direction of the display device. The transparent conductive material may include, e.g., ITO, IZO, ITZO, etc., but the disclosure is not limited thereto. The transparent conductive material may include materials which minimize loss of light and have conductivity.

The 1-1-th capping layer CPL1_1 may be directly provided and/or formed on the first electrodes EL1, MAE1 and electrically and/or physically connected with the first electrodes ELL MAE1. The 1-1-th capping layer CPL1_1 may prevent the first electrodes EL1, MAE1 from being damaged by a defect which may occur during a process of fabricating the display device, and may function to enhance adhesive force between the first electrodes EL1, MAE1 and the passivation layer PSV.

The 1-1-th capping layer CPL1_1 may be electrically connected to the first transistor T1 of the pixel circuit layer PCL through the first contact hole CH1 that passes through the passivation layer PSV. Hence, a signal (or a voltage) applied to the first transistor T1 may be transmitted to the 1-1-th capping layer CPL1_1.

The 1-2-th capping layer CPL1_2 may be directly provided and/or formed on the first connection line CNL1 and electrically and/or physically connected with the first connection line CNL1. The 1-2-th capping layer CPL1_2 may protect the first connection line CNL1 and enhance adhesive force between the first connection line CNL1 and the passivation layer PSV.

In an embodiment, the 1-1-th capping layer CPL1_1 and the 1-2-th capping layer CPL1_2 may be integrally provided and electrically and/or physically connected to each other. In case that the 1-1-th capping layer CPL1_1 and the 1-2-th capping layer CPL1_2 are integrally formed and/or provided, the 1-2-th capping layer CPL1_2 may be a predetermined area of the 1-1-th capping layer CPL1_1, or the 1-1-th capping layer CPL1_1 may be a predetermined area of the 1-2-th capping layer CPL1_2.

In an embodiment, the 1-1-th capping layer CPL1_1 may be designed to have a relatively large width in an area in which the 1-1-th capping layer CPL1_1 overlaps the first electrodes EL1, MAE1, compared to that of an area in which the 1-1-th capping layer CPL1_1 does not overlap the first electrodes EL1, MAE1. Particularly, the 1-1-th capping layer CPL1_1 may be designed to have a surface area (or size) greater than that of each of the first electrodes EL1, MAE1 so as to secure reliable electrical and/or physical connection with the first electrodes EL1, MAE1. Hence, the 1-1-th capping layer CPL1_1 may have a shape in the width of which with respect to the first direction DR1 is not constant in an extension direction thereof.

The 1-1-th capping layer CPL1_1 may extend in the second direction DR2 and overlap the first electrodes EL1, MAE1, so that the first electrodes EL1, MAE1 may be electrically connected to each other by the 1-1-th capping layer CPL1_1. Hence, a signal (or a voltage) transmitted to the 1-1-th capping layer CPL1_1 may be transmitted to each of the first electrodes EL1, MAE1. Therefore, a predetermined signal (or voltage) may be supplied to one of the opposite ends EP1 and EP2 of each of the light emitting elements LD through the first electrodes EL1, MAE1.

In an embodiment, the second capping layer CPL2 may include a 2-1-th capping layer CPL2_1 extending in the second direction DR2, and a 2-2-th capping layer CPL2_2 extending in the first direction DR1. The second capping layer CPL2 and the first capping layer CPL1 may include the same material.

The 2-1-th capping layer CPL2_1 may be directly provided and/or formed on the second electrodes EL2, MAE2 and electrically and/or physically connected with the second electrodes EL2, MAE2. The 2-1-th capping layer CPL2_1 may cover (or overlap) the second electrodes EL2, MAE2 and protect the second electrodes EL2, MAE2, and may function to enhance adhesive force between the second electrodes EL2, MAE2 and the passivation layer PSV.

The 2-2-th capping layer CPL2_2 may be directly provided and/or formed on the second connection line CNL2 and electrically and/or physically connected with the second connection line CNL2. The 2-2-th capping layer CPL2_2 may protect the second connection line CNL2 and enhance adhesive force between the second connection line CNL2 and the passivation layer PSV. Since the second connection line CNL2 is electrically connected with the 2-2-th capping layer CPL2_2, the voltage of the second driving power supply VSS that is applied to the second connection line CNL2 may be transmitted to the 2-2-th capping layer CPL2_2.

In an embodiment, the 2-1-th capping layer CPL2_1 and the 2-2-th capping layer CPL2_2 may be integrally provided and be electrically and/or physically connected to each other. In case that the 2-1-th capping layer CPL2_1 and the 2-2-th capping layer CPL2_2 are integrally formed and/or provided, the 2-2-th capping layer CPL2_2 may be a predetermined area of the 2-1-th capping layer CPL2_1, or the 2-1-th capping layer CPL2_1 may be a predetermined area of the 2-2-th capping layer CPL2_2.

In an embodiment, the 2-1-th capping layer CPL2_1 may be designed to have a relatively large width in an area in which the 2-1-th capping layer CPL2_1 overlaps the second electrodes EL2, MAE2, compared to that of an area in which the 2-1-th capping layer CPL2_1 does not overlap the second electrodes EL2, MAE2. The 2-1-th capping layer CPL2_1 may be designed to have a surface area (or size) greater than each of the second electrodes EL2, MAE2 so as to secure reliable electrical and/or physical connection with the second electrodes EL2, MAE2. Hence, the 2-1-th capping layer CPL2_1 may have a shape in which the width thereof with respect to the first direction DR1 is not constant in an extension direction thereof.

The 2-1-th capping layer CPL2_1 may extend in the second direction DR2 and overlap the second electrodes EL2, MAE2, so that the second electrodes EL2, MAE2 may be electrically connected to each other by the 2-1-th capping layer CPL2_1. Hence, the voltage of the second driving power supply VSS that is transmitted to the 2-1-th capping layer CPL2_1 may be transmitted to each of the second electrodes EL2, MAE2. Therefore, the voltage of the second driving power supply VSS may be supplied to the other of the opposite ends EP1 and EP2 of each of the light emitting elements LD through the second electrodes EL2, MAE2.

As described above, in case that each of the first electrodes EL1, MAE1 is spaced apart from first electrodes EL1, MAE1 adjacent thereto in the second direction DR2, a surface area occupied by the first electrodes EL1, MAE1 in the emission area EMA of each of the pixels PXL may be reduced. Likewise, in case that each of the second electrodes EL2, MAE2 is spaced apart from second electrodes EL2, MAE2 adjacent thereto in the second direction DR2, a surface area occupied by the second electrodes EL2, MAE2 in the emission area EMA of each of the pixels PXL may be reduced.

In the emission area EMA of each of the pixels PXL, if the surface areas occupied by the first electrodes EL1, MAE1 and the second electrodes EL2, MAE2 that are made of opaque conductive material having a predetermined reflectivity are reduced, a sufficient aperture ratio of the corresponding pixel PXL may be secured. In case that the display device in accordance with an embodiment is a transparent display device, the transmissivity of light drawn from the rear surface and/or the front surface of the substrate SUB is increased because a sufficient aperture ratio of each of the pixels PXL is secured. Consequently, the image quality of the transparent display device may be enhanced.

As described above, a display device in accordance with various embodiments may be provided with a first electrode EL1 and a second electrode EL2 each having a width which is not constant in an extension direction thereof, so that light emitting elements LD may be aligned in various directions in the emission area EMA of each of the pixels PXL, whereby light emitted from each of the light emitting elements LD can be prevented from being concentrated in a specific direction.

Hence, the display device in accordance with various embodiments may have a uniform light output distribution in the overall area thereof.

While various embodiments have been described above, those skilled in the art will appreciate that various modifications, additions and substitutions are possible, without departing from the scope of the disclosure.

Therefore, the embodiments disclosed in this specification are only for illustrative purposes rather than limiting the technical scope of the disclosure. The scope of the claimed invention must be defined by the accompanying claims.

What is claimed is:
1. A display device comprising:
a substrate including a display area and a non-display area; and
at least one pixel provided in the display area, and comprising:
a pixel circuit layer including at least one transistor; and
a display element layer, wherein
the display element layer includes:
at least one light emitting element emitting light; and
a first electrode and a second electrode spaced apart from each other, disposed on the substrate, and extending in a first direction,
the at least one light emitting element is electrically connected to each of the first and the second electrodes,
the first electrode has at least two widths in an extension direction of the first electrode, and
the second electrode has at least two widths in an extension direction of the second electrode.

2. The display device according to claim 1, wherein
the first electrode comprises:
first main electrodes extending in the first direction; and
first auxiliary electrodes electrically connected to the first main electrodes, and
the second electrode comprises:
second main electrodes spaced apart from the first main electrodes and extending in the first direction; and
second auxiliary electrodes electrically connected to the second main electrodes.

3. The display device according to claim 2, wherein the first main electrodes and the first auxiliary electrodes are integral with each other, and the second main electrodes and the second auxiliary electrodes are integral with each other.

4. The display device according to claim 3, wherein
the first main electrodes and the first auxiliary electrodes have shapes different from each other, and
the second main electrodes and the second auxiliary electrodes have shapes different from each other.

5. The display device according to claim 3, wherein
a width of each of the first main electrodes is greater than a width of each of the first auxiliary electrodes, and
a width of each of the second main electrodes is greater than a width of each of the second auxiliary electrodes.

6. The display device according to claim 3, wherein
each of the first main electrodes has a shape different from a shape of the first main electrode adjacent to a corresponding one of the first main electrodes in the first direction, and
each of the second main electrodes has a shape different from a shape of the second main electrode adjacent to a corresponding one of the second main electrodes in the first direction.

7. The display device according to claim 3, wherein
each of the first main electrodes and each of the second main electrodes have an identical shape, and
each of the first auxiliary electrodes and each of the second auxiliary electrodes have an identical shape.

8. The display device according to claim 7, wherein
the first auxiliary electrodes comprise 1-1-th auxiliary electrodes and 1-2-th auxiliary electrodes which have widths different from each other, and
the second auxiliary electrodes comprise 2-1-th auxiliary electrodes and 2-2-th auxiliary electrodes which have widths different from each other.

9. The display device according to claim 3, wherein each of the first main electrodes and each of the second main electrodes have different shapes.

10. The display device according to claim 3, wherein in a plan view the first main electrodes and the second auxiliary electrodes are alternately disposed in a second direction intersecting the first direction, and the second main electrodes and the first auxiliary electrodes are alternately disposed in the second direction.

11. The display device according to claim 10, wherein the first main electrodes and the second main electrodes are not disposed in an identical row.

12. The display device according to claim 11, wherein, in the second direction, the first main electrodes and the second auxiliary electrodes correspond to each other, and the second main electrodes and the first auxiliary electrodes correspond to each other.

13. The display device according to claim 2, wherein
among the first main electrodes, the first main electrodes that are disposed in an identical column are spaced apart from each other, and
among the second main electrodes, the second main electrodes that are disposed in an identical column are spaced apart from each other.

14. The display device according to claim 13, wherein the display element layer comprises:
a first capping layer disposed directly on the first main electrodes and electrically connecting the first main electrodes adjacent to each other in the first direction; and
a second capping layer disposed directly on the second main electrodes and electrically connecting the second main electrodes adjacent to each other in the first direction.

15. The display device according to claim 10, wherein the display element layer comprises:
a first connection line extending in the second direction and electrically connected with the first electrode;
a second connection line extending parallel to the first connection line and electrically connected with the second electrode;
a bank pattern disposed under each of the first electrode and the second electrode;
a first contact electrode electrically connecting the first electrode with an end of the at least one light emitting element; and
a second contact electrode electrically connecting the second electrode with another end of the at least one light emitting element.

16. The display device according to claim 15, wherein the first connection line and the first electrode are integral with each other, and the second connection line and the second electrode are integral with each other.

17. The display device according to claim 15, wherein the display element layer comprises:
a first insulating layer overlapping a portion of each of the first and the second electrodes, and
a second insulating layer disposed on an upper surface of the at least one light emitting element, and
the first contact electrode and the second contact electrode are spaced apart from each other on the second insulating layer and electrically disconnected from each other.

18. A pixel comprising:
a first electrode and a second electrode spaced apart from each other on an identical plane, and extending in a direction; and
at least one light emitting element electrically connected to each of the first electrode and the second electrode, wherein
the first electrode has at least two widths in an extension direction of the first electrode, and
the second electrode has at least two widths in an extension direction of the second electrode.

19. The pixel according to claim 18, wherein
the first electrode comprises:
first main electrodes extending in the direction; and
first auxiliary electrodes electrically connected to the first main electrodes, and
the second electrode comprises:
second main electrodes spaced apart from the first main electrodes and extending in the direction; and
second auxiliary electrodes electrically connected to the second main electrodes.

20. The pixel according to claim 19, wherein
the first main electrodes and the first auxiliary electrodes are integral with each other, and the second main electrodes and the second auxiliary electrodes are integral with each other.

21. The display device of claim 1, wherein
the first electrode and the second electrode each extend in a first direction;
the extension direction of the first electrode and the extension direction of the second electrode extend in a second direction perpendicular to the first direction;
the at least one light emitting diode extending from the first electrode to the second electrode in a third direction intersecting the first direction and the second direction.

22. The display device of claim 1, wherein
the light emitting element is directly electrically connected to the first electrode via a first contact electrode and a conductive capping layer, the first contact electrode directly electrically connected to the light emitting element and the conductive capping layer, and the conductive capping layer directly electrically connected to the first electrode;
the light emitting element is directly electrically connected to the second electrode via a second contact electrode and the conductive capping layer, the second contact electrode directly electrically connected to the light emitting element and the conductive capping layer, and the conductive capping layer directly electrically connected to the second electrode.

* * * * *